United States Patent
Oh et al.

(10) Patent No.: US 7,510,932 B2
(45) Date of Patent: Mar. 31, 2009

(54) SEMICONDUCTOR DEVICES HAVING A FIELD EFFECT TRANSISTOR AND METHODS OF FABRICATING THE SAME

(75) Inventors: Chang-Woo Oh, Gyeonggi-do (KR);
Dong-Gun Park, Gyeonggi-do (KR);
Dong-Won Kim, Gyeonggi-do (KR);
Jeong-Dong Choe, Gyeonggi-do (KR)

(73) Assignee: SAms Samsung Electronics Co., Ltd., Suwon-si, Gyeonggi-do (KR)

( * ) Notice: Subject to any disclaimer, the term of this patent is extended or adjusted under 35 U.S.C. 154(b) by 65 days.

(21) Appl. No.: 11/764,751

(22) Filed: Jun. 18, 2007

(65) Prior Publication Data
US 2008/0032469 A1 Feb. 7, 2008

Related U.S. Application Data

(62) Division of application No. 11/090,740, filed on Mar. 24, 2005, now Pat. No. 7,247,896.

(30) Foreign Application Priority Data
Apr. 9, 2004 (KR) ................. 2004-24599

(51) Int. Cl.
*H01L 21/336* (2006.01)
(52) U.S. Cl. .............. 438/257; 438/258; 438/311; 438/933; 257/E21.004; 257/E21.17; 257/E21.102; 257/E21.207; 257/E21.135
(58) Field of Classification Search ............... 438/257, 438/258, 259, 267, 270, 297, 311, 680, 700, 438/733, 752, 753, 933
See application file for complete search history.

(56) References Cited

U.S. PATENT DOCUMENTS

| 6,251,733 | B1 | 6/2001 | Yamazaki |
| 6,259,120 | B1 | 7/2001 | Zhang et al. |
| 6,307,220 | B1 | 10/2001 | Yamazaki |
| 6,573,195 | B1 | 6/2003 | Yamazaki et al. |
| 6,693,299 | B1 | 2/2004 | Yamazaki et al. |
| 6,919,282 | B2 | 7/2005 | Sakama et al. |
| 7,247,896 | B2 * | 7/2007 | Oh et al. ............ 257/288 |
| 2005/0158934 | A1 | 7/2005 | Yun et al. |

FOREIGN PATENT DOCUMENTS

| JP | 2000-294781 | 10/2000 |
| JP | 2003-31803 | 1/2003 |
| JP | 2003-318110 | 11/2003 |
| KR | 2003-0005044 | 1/2003 |
| KR | 10-2004-0011368 | 2/2004 |

OTHER PUBLICATIONS

English language translation of Japanese Publication No. 2000-294781.

(Continued)

*Primary Examiner*—David Nhu
(74) *Attorney, Agent, or Firm*—Marger Johnson & McCollom, P.C.

(57) ABSTRACT

A semiconductor device having a field effect transistor and a method of forming the same are provided. The semiconductor device preferably includes a device active pattern disposed on a predetermined region of the substrate. The gate electrode preferably crosses over the device active pattern, interposed by a gate insulation layer. A support pattern is preferably interposed between the device active pattern and the substrate. The support pattern can be disposed under the gate electrode. A filling insulation pattern is preferably disposed between the device active pattern and the filling insulation pattern. The filling insulation pattern may be disposed under the source/drain region. A device active pattern under the gate electrode is preferably formed of a strained silicon having a lattice width wider than a silicon lattice.

19 Claims, 18 Drawing Sheets

OTHER PUBLICATIONS

English language translation of Korean Publication No. 2003-0005044.

English language translation of Japanese Publication No. 2003-31803.

English language translation of Japanese Publication No. 2003-318110.

English language translation of Korean Publication No. 10-2004-0011368.

* cited by examiner

SEMICONDUCTOR DEVICES HAVING A FIELD EFFECT TRANSISTOR AND METHODS OF FABRICATING THE SAME

CROSS-REFERENCE TO RELATED APPLICATIONS

This case is a Divisional of U.S. patent application Ser. No. 11/090,740, filed on Mar. 24, 2005, now U.S. Pat. No. 7,247,896, which claims priority under 35 U.S.C. § 119 from Korean Patent Application No. 2004-24599, filed on Apr. 9, 2004, the entire contents of which are hereby incorporated by reference.

BACKGROUND OF THE INVENTION

The present invention relates to a semiconductor device and a method of forming the same and specifically to a semiconductor device including a field effect transistor and a method of forming the same.

As semiconductor devices become more highly integrated, field effect transistors in those devices suffer from various problems. For instance, a punch through characteristic of source/drain regions in the transistor becomes degraded as a channel length is decreased. In addition, when the source/drain regions are formed having a shallow junction, junction leakage current of the source/drain regions increases. This may cause a malfunction of the transistor or increase power dissipation of the semiconductor device. In addition, a channel width of the transistor is generally reduced to decrease a turn-on current of the transistor. If the turn-on current is decreased, an operation rate of the transistor is also decreased, thereby lowering an operation rate of the semiconductor device.

In the present semiconductor industry, a high operation rate with a low power supply is required, together with a high integration density. Therefore, extensive studies have been undertaken to solve those problems.

SUMMARY OF THE INVENTION

An aspect of the present invention is to provide a semiconductor device having a transistor capable of reducing a junction leakage current of a source/drain region.

Another aspect of the present invention is to provide a semiconductor device having a transistor capable of improving a punch through characteristic between the source/drain regions.

Still another aspect of the present invention is to provide a semiconductor device having a transistor capable of increasing a turn-on current.

Still another aspect of the present invention is to provide a semiconductor device having a transistor capable of operating at a high speed, with a high integration density. Other aspects of the invention relate to methods of fabricating improved semiconductor devices having the attributes described above.

The present invention contemplates a semiconductor device having a transistor. The device preferably includes a device active pattern. A gate electrode preferably crosses over the device active pattern being interposed by a gate insulation layer. A source/drain region is preferably formed in the device active pattern along both sides of the gate electrode. A support pattern is preferably disposed under the gate electrode, between the device active pattern and the substrate. A filling insulation pattern is preferably disposed under the source/drain region between the device active pattern and the substrate. The device active pattern under the gate electrode is preferably a strained silicon having a lattice width wider than a silicon lattice.

Specifically, the gate electrode may cross over a top surface of the device active pattern. Alternatively, the gate electrode may surround a top surface and sidewalls of the device active pattern. When the gate electrode surrounds the top surface and both sidewalls of the device active pattern, the device may further include a capping pattern intervening between the gate electrode and a top surface of the device active pattern.

The support pattern may be formed of silicon germanium. In this embodiment, the silicon germanium is preferably doped with impurities. The support pattern and the source/drain regions may be doped with different types of impurities. The filling insulation pattern may include a vacancy. The device may further include a spacer formed on both sidewalls of the gate electrode. In this case, the filling insulation pattern may comprise the same material as the spacer. The device may further comprise a supplementary filling pattern surrounding sidewalls of the device active pattern and the filling insulation pattern at both sides of the gate electrode. The filling insulation pattern may further comprise the same material as the supplementary filling pattern.

In one exemplary embodiment, a semiconductor device may comprise a device active pattern disposed on a predetermined region of a substrate and a gate electrode crossing over a top surface of the device active pattern being interposed with a gate insulation layer. A device isolation layer covering both sidewalls of the device active pattern is preferably disposed under the gate electrode, arranged between a portion of the gate electrode disposed at both sides of the device active pattern and the substrate. A source/drain region can be formed in the device active pattern at both sides of the gate electrode with a support pattern disposed under the gate electrode between the device active pattern and the substrate. A filling insulation pattern is preferably disposed under the source/drain region, between the device active pattern and the substrate. The device active pattern under the gate electrode can be a strained silicon having a lattice width wider than a silicon lattice. The device active pattern under the gate electrode can be a strained silicon having a lattice width wider than a silicon lattice.

In another exemplary embodiment of the present invention, a semiconductor device may include a pin-type device active pattern disposed on a predetermined region of a substrate. A gate electrode preferably surrounds a top surface and both sidewalls of the device active pattern and crosses over the device active pattern, being interposed within a gate insulation layer. A source/drain region is preferably formed on the device active pattern at opposite sides of the gate electrode. A support pattern is preferably disposed between the device active pattern and the substrate, under the gate electrode. A filling insulation pattern can be disposed under the source/drain region, between the device active pattern and the substrate. The device active pattern under the gate electrode is preferably a strained silicon having a lattice width wider than a silicon lattice.

A method of forming a semiconductor device is also contemplated. The method preferably includes forming a support pattern and a device active pattern that are sequentially stacked on a substrate; doping a portion of the support pattern; forming a gate electrode crossing over the device active pattern, interposed within a gate insulation layer and disposed on a doped portion of the support pattern; forming an undercut region by removing a non-doped portion of the support pattern; forming a filling insulation pattern in the under region; and forming a source/drain region in the device active pattern at both sides of the gate electrode. In this case, the device active pattern under the gate electrode is preferably formed of a strained silicon having a lattice width wider than a silicon lattice.

Before forming the gate electrode, the method may further comprise forming a device isolation layer surrounding sidewalls of the support pattern and the device active pattern. In this case, forming the undercut region preferably includes exposing the non-doped portion of the sidewall of the support pattern by recessing a portion of the device isolation layer and forming the undercut region by removing the non-doped portion of the support pattern.

Doping a portion of the support pattern and forming the gate electrode may include forming a mold layer having a groove crossing over the device active pattern and covering the device active pattern and the device isolation pattern; doping a portion of the support pattern by implanting impurity ions using the mold layer as a mask; forming a gate electrode filling the groove interposed by the gate insulation layer; and removing the mold layer.

Doping a portion of the support pattern and forming the gate electrode may include forming a mold layer having a groove that covers the active pattern, crosses over the device active pattern, and exposes a portion of the device isolation layer; exposing sidewalls of the device active pattern by anisotropically etching the device isolation layer exposed by the groove; implanting impurity ions using the mold layer as a mask to dope a portion of the support pattern; forming a gate electrode filling the groove and the anisotropically etched region of the device isolation layer, the gate electrode being interposed within a gate insulation layer; and removing the mold layer.

Alternatively, doping a portion of the support pattern and forming the gate electrode may include forming a mold layer covering the device active pattern and the device isolation layer; forming a groove crossing over the device active pattern by patterning the mold layer; doping a portion of the support pattern by implanting impurity ions using the mold layer as a mask; forming a gate electrode to fill the groove, the gate electrode and the device active pattern being interposed by the gate insulation layer; and removing the mold layer. In this embodiment, the method may further comprise forming a capping pattern disposed on the device active pattern before forming the mold layer.

The doped portion of the support pattern and the source/drain region may be doped with different types of impurities. The support pattern may be formed of silicon germanium. The filling insulation pattern may include a vacancy. The method may further include forming a gate spacer on both sidewalls of the gate electrode. In this case, the filling insulating pattern may include the same material as a material of the gate spacer. The method may further include forming a supplementary burred pattern surrounding sidewalls of the device active pattern and the filling insulation pattern. In this case, the filling insulation pattern may include the same material as a material of the filling insulation pattern.

In another embodiment of the present invention, a method of forming a semiconductor device may include forming a support pattern and a device active pattern that are sequentially stacked on a substrate. A device isolation layer surrounding sidewalls of the patterns is formed and a portion of the support pattern is doped. A gate electrode is formed on the doped portion of the support pattern which crosses over the device active pattern and being interposed by the gate insulation layer. A sidewall of a non-doped portion of the support pattern is exposed by recessing a portion of the device isolation layer at the sides of the gate electrode. An undercut region is formed by removing the non-doped portion of the support pattern by means of a selective isotropic etch method, and a filling insulation pattern is formed in the undercut region. A source/drain region is formed in the device active pattern at both sides of the gate electrode. The device active pattern under the gate electrode is formed of a strained silicon having a lattice width wider than the device active pattern under the gate electrode.

In yet another exemplary embodiment of the present invention, a method of forming a semiconductor device includes forming a support pattern and a pin-type device active pattern that are sequentially stacked on a substrate; forming a device isolation layer surrounding sidewalls of the patterns; doping a portion of the support pattern; exposing both sidewalls of the device active pattern placed on a doped portion of the support pattern; forming a gate electrode on the doped portion of the support pattern, the gate electrode crossing over the exposed both sidewalls and top surface of the device active pattern being interposed by a gate insulation layer; exposing a sidewall of the non-doped portion of the support pattern by recessing a portion of the device isolation layer; forming an undercut region by removing the non-doped portion of the support pattern by means of an isotropic etch method; forming a filling insulation pattern in the undercut region; and forming a source/drain region in the device active pattern at both sides of the gate electrode. The device active pattern under the gate electrode is preferably formed of a strained silicon having a lattice width wider than a silicon lattice.

BRIEF DESCRIPTION OF THE DRAWINGS

The accompanying drawings are included to provide a further understanding of the invention and are incorporated in and constitute a part of this specification. The drawings illustrate various exemplary embodiments of the present invention and, together with the description, serve to explain principles of the present invention.

In the drawings:

FIGS. 5A through 13A are cross-sectional views of the semiconductor device of FIG. 1, taken along line I-I, illustrating a method of forming the semiconductor device in accordance with one embodiment of the present invention.

FIGS. 5B through 13B are cross-sectional views of the semiconductor device of FIG. 1, taken along line II-II, illustrating a method of forming the semiconductor device in accordance with one embodiment of the present invention.

FIGS. 19A through 22A are cross-sectional views taken along a line III-III' in FIG. 16, illustrating a method of forming the semiconductor device shown in FIG. 16 according to another embodiment of the present invention.

FIGS. 20B through 22B are cross-sectional views taken along a line IV-IV' in FIG. 16, illustrating a method of forming the semiconductor device shown in FIG. 16 according to another embodiment of the present invention.

DETAILED DESCRIPTION OF PREFERRED EMBODIMENTS

Preferred embodiments of the present invention will be described below in greater detail with reference to the accompanying drawings. The present invention may, however, be embodied in different forms and should not be construed as limited to the particular embodiments set forth herein. Rather, these embodiments are provided so that this disclosure will be thorough and complete, and will fully convey the scope of the invention to those skilled in the art. Like numerals refer to like elements throughout the specification.

Hereinafter, various exemplary embodiments of the present invention will be described in conjunction with the accompanying drawings.

Figure 1:
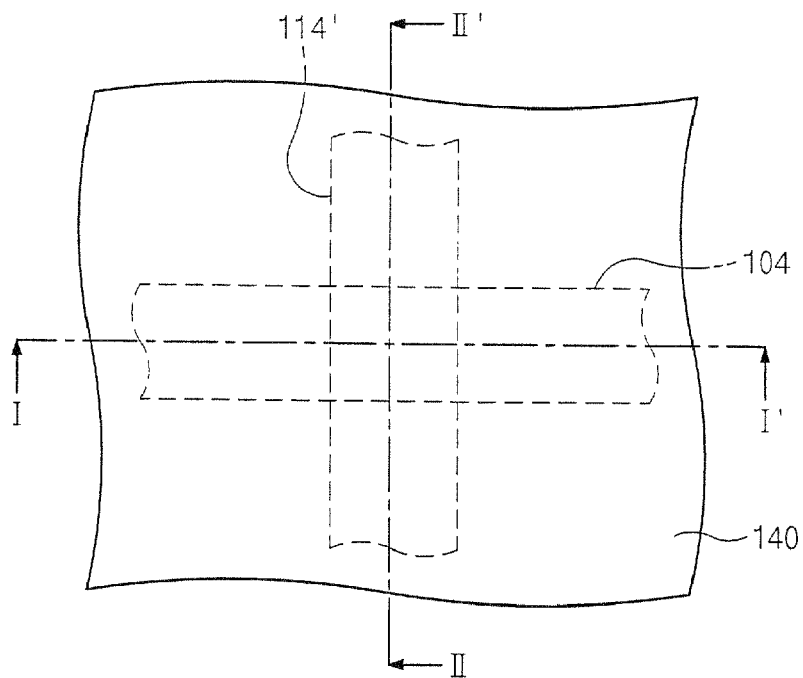
FIG. 1 is a top plan view of a semiconductor device in accordance with one exemplary embodiment of the present invention.
Figure 2:
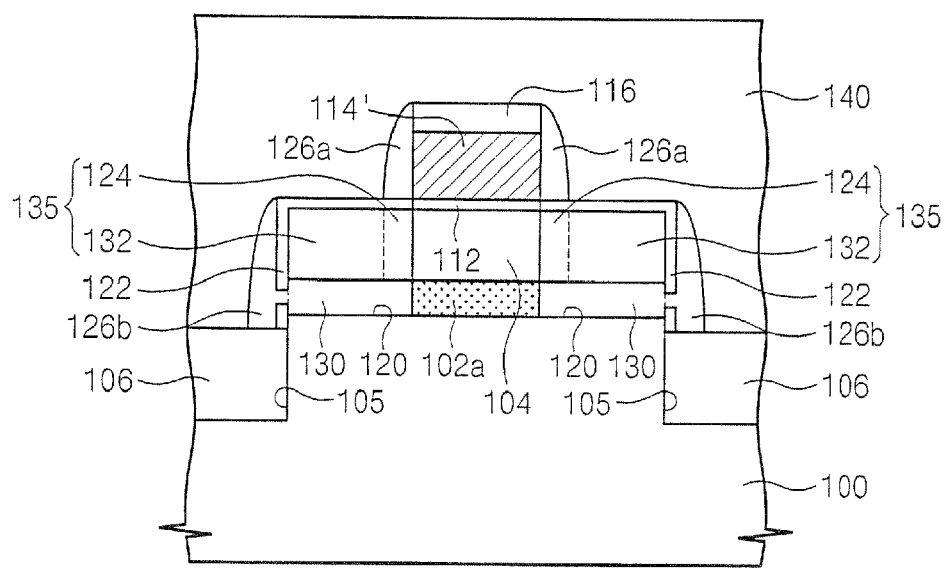
FIG. 2 is a cross-sectional view of the semiconductor device of FIG. 1, taken along line I-I'.

One embodiment of the present invention will now be described with reference to FIGS. 1, 2 and 3. FIG. 1 is a top plan view of a semiconductor device in accordance with one exemplary embodiment of the present invention. FIG. 2 is a cross-sectional view of the semiconductor device taken along line I-I' in FIG. 1, and FIG. 3 is a cross-sectional view taken along line II-II' in FIG. 1.

Figure 3:
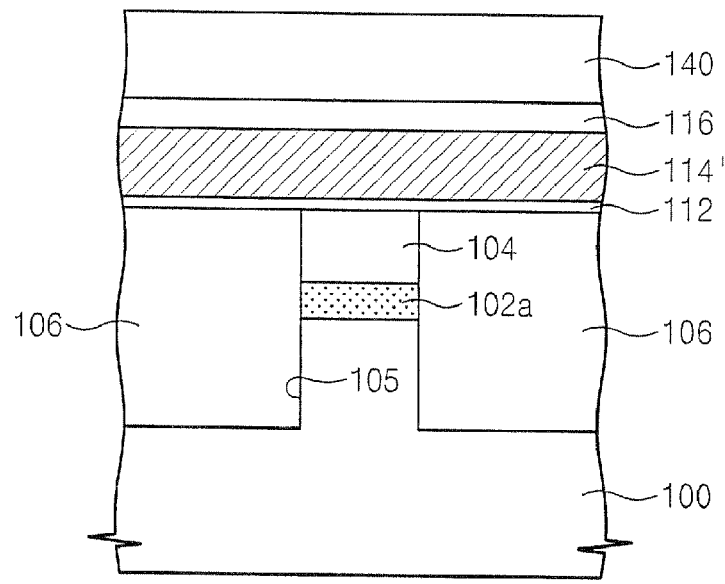
FIG. 3 is a cross-sectional view of the semiconductor device of FIG. 1, taken along line II-II'.

Referring to FIGS. 1, 2 and 3, a device active pattern 104 is formed on a substrate 100. A doped support pattern 102a is interposed between the device active pattern 104 and the substrate 100. The doped support pattern 102a may be interposed between a center of the device active pattern and the substrate 100. A filling insulation pattern 130 is placed in undercut region 120 at both sides of the doped support pattern 100. The filling insulation pattern 130 is disposed between the device active pattern 104 and the substrate 100.

The substrate 100 may a silicon substrate. The doped support pattern 102a has etch selectivity with respect to the substrate 100 and the device active pattern 104, and may be formed of a semiconductor layer having a lattice width wider than that of a silicon lattice. For instance, the doped support pattern 102a may be formed of silicon germanium. In addition, the doped support pattern 102a may be formed of silicon germanium doped with specific impurities, such as boron, phosphorus, or the like. The device active pattern 104 may be a silicon layer. Particularly, a portion of the device active pattern 104 on the doped support pattern 102a may be formed of strained silicon having a lattice width wider than the silicon lattice. A strained state of the strained silicon may be maintained by the doped support pattern 102a. The filling insulation pattern 130 is preferably formed of insulation material.

A trench 105 is disposed to surround the patterns 104, 102a, and 130. The trench 105 defines the device active pattern 104. A sidewall of the trench 105 includes the patterns 104, 102a, and 130, and a bottom surface of the trench 105 may be placed lower than a top surface of the substrate 100 that is disposed under the patterns 104, 102a, and 130. That is, the substrate 100 under the patterns 104, 102a, and 130 may protrude upwardly in comparison to the top surface of the remainder of the substrate 100. A device isolation layer 106 is disposed in the trench 105. The device isolation layer 106 is formed of insulation material. For instance, the device isolation layer 106 may be formed of silicon oxide.

A gate electrode 114' crosses over the device active pattern 104. The gate electrode 114' may be disposed over the doped support pattern 102a. In other words, the gate electrode 114' is preferably disposed over the strained silicon. A gate insulation layer 112 is preferably disposed (or interposed) between the gate electrode 114' and the device active pattern 104. The gate electrode 114' is shown in the drawings to have the same width as the doped support pattern 102a but the gate electrode 114' may be wider or narrower than the doped support pattern 102a. The gate electrode 114' extends over the device isolation layer 106. A portion of the device isolation layer 106 placed under the gate electrode 114' preferably covers a sidewall of the device active pattern 104 under the gate electrode 114'. In other words, a portion of the device isolation layer 106 under the gate electrode 114' may be as high as or higher than a top surface of the device active pattern 104. Therefore, the gate electrode 114' preferably crosses over the top surface of the device active pattern 104. Top surfaces of portions of the device isolation layer 106 disposed at both sides of the gate electrode 114' may be arranged lower than the filling insulation pattern 130. A gate mask pattern 116 may be disposed on the gate electrode 114'. The gate mask pattern 116 preferably has a sidewall aligned with a sidewall of the gate electrode 114'. A Gate spacer 126a may be disposed on both sidewalls of the gate electrode 114'.

The gate electrode 114' may be formed of a conductive layer. For instance, the gate electrode 114' may be formed of doped polysilicon. In addition, the gate electrode 114' may be formed of a polycide comprising a doped polysilicon layer and a metal silicide layer that are sequentially stacked on a substrate. In addition, the gate electrode 114' may be formed of material containing conductive metal. The conductive metal may, for instance, be tungsten or molybdenum, conductive metal nitride such as titanium nitride or tantalum nitride, or metal silicide such as cobalt silicide or titanium silicide.

Source/drain regions 135 are preferably disposed in the device active pattern 104 at both sides of the gate electrode 114'. The source/drain regions 135 may have a first doped layer 124 and a second doped layer 132. The first doped layer 124 may have a concentration lower than that of the second doped layer 132. The first and second doped layers 124 and 132 are preferably arranged in a LDD structure. Alternatively, the first doped layer 124 may have a concentration similar to that of the second doped layer 132. The source/drain regions 135 are disposed on the filling insulation pattern 130. More specifically, a bottom surface of the source/drain regions 135 may contact the filling insulation pattern 130. The source/drain regions 135 are preferably formed of an impurity doped layer implanted with impurities. In this case, the source/drain regions 135 are preferably implanted with impurities of a type different from that of the doped support pattern 102a. For example, if the source/drain regions 135 are implanted with p-type impurities, the doped support pattern 102a is preferably implanted with n-type impurities. Meanwhile, if the source/drain regions 135 are implanted with n-type impurities, the doped support pattern 102a is preferably implanted with p-type impurities.

A surface insulation layer 122 may be disposed on a surface of the device active pattern 104 at both sides of the gate electrode 114'. The surface insulation layer 122 may be formed of thermal oxide.

The filling insulation pattern 130 may contain the same material as the surface insulation layer 122. The filling insulation pattern 130 may include a vacancy. A portion of the vacancy is void. The filling insulation pattern 130 may contain the same material as the gate spacer 126a. In this case, a residual spacer 126b may be disposed on sidewalls of the filling insulation pattern and the device active pattern 104 located at both sides of the gate electrode 114'. The residual spacer 126b is preferably formed of the same material as the gate spacer 126a.

An interlayer insulation layer 140 may be placed to cover an entire surface of the resultant structure. The interlayer insulation layer 140 may be formed of silicon oxide. The interlayer insulation layer 140 may fill a vacant portion of the trench 105 located at both sides of the gate electrode 114'. That is, a top surface of the device isolation layer 106 at both sides of the gate electrode 114' may be placed under the filling insulation pattern 130, such that an upper portion of the trench 105 is vacant. The interlayer insulation layer 140 may fill the vacant portion of the trench 105. If the gate spacer 126a is not formed, the residual spacer 126b is not formed either, and the filling insulation pattern 130 may contain the same material as the interlayer insulation layer 140. Alternatively, a vacant portion of the trench 105 may be filled with another material. One alternative example will now be explained with reference to FIG. 4.

Figure 4:
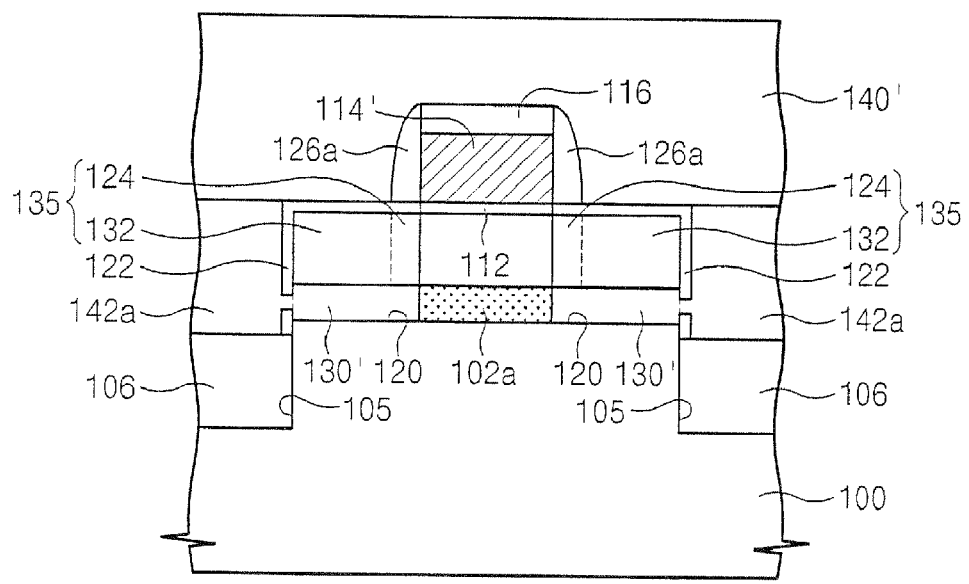
FIG. 4 is a cross-sectional view of the semiconductor device of FIG. 1, taken along line I-I, illustrating an alternate embodiment of the present invention.

FIG. 4 is a cross-sectional view, taken along a line I-I' in FIG. 1, illustrating a semiconductor device according to another embodiment of the present invention. Referring to FIG. 4, a supplementary filling pattern 142a can be used to fill the vacant portion of the trench 105 at both side sides of the gate electrode 114'. A top surface of the supplementary filling pattern 142a may approach a top surface of the device active pattern 104. In this case, the filling insulation pattern 130' may contain the same material as the supplementary filling pattern 142a. The interlayer insulation layer 140' covers the supplementary filling pattern 142a and the gate electrode 114'. In this embodiment, the residual spacer 126b (shown in FIG. 3) may be omitted. The supplementary filling pattern 142a may be formed of an insulation layer which has a good gap-fill characteristic and is well-planarized. For example, the supplementary pattern 142a may be formed of a SOG layer.

In the semiconductor device having a transistor structure as described above, the filling insulation pattern 130 is preferably disposed under the source/drain regions 135. A junction leakage current of the source/drain regions 135 may therefore be reduced. Moreover, a punch through characteristic can be drastically improved between the source/drain regions 135. As a result, a more efficient, highly integrated device can be provided.

The channel region under the gate electrode 114' may be formed of a strained silicon having a lattice width wider than that of the silicon lattice. This structure can increase a turn-on current of the transistor and thereby improve the operation speed of the transistor to provide a semiconductor device having a high rate of operation.

Moreover by connecting the device active pattern 104 to the substrate 100 by the doped support pattern 102a, a floating body effect that might occur at the SOI substrate can be prevented. Heat generated by repeated operations of the transistor can therefore be effectively emitted.

FIGS. 5A through 13A are cross-sectional views taken a along a line I-I' in FIG. 1, illustrating a method of forming the semiconductor device in accordance with one embodiment of the present invention. FIGS. 5B through 13B are cross-sectional views along a line II-II' in FIG. 1, illustrating the method of forming the semiconductor device according to this embodiment.

Figure 5A:
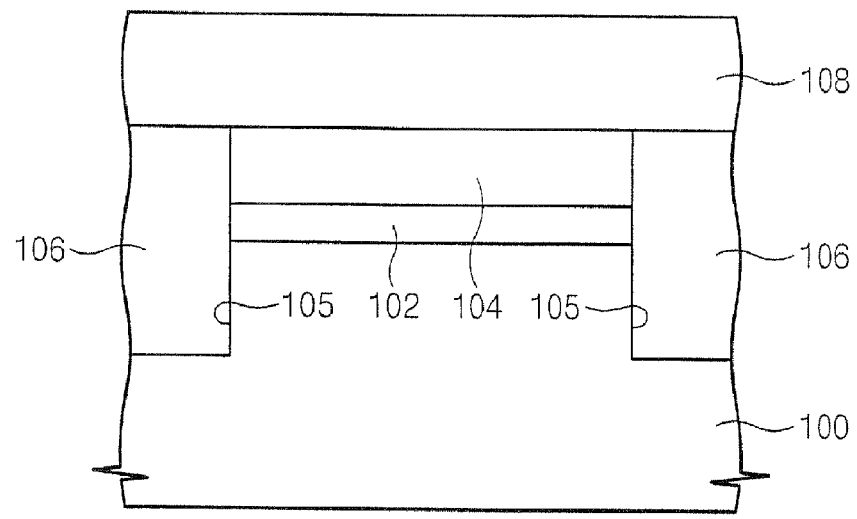
Figure 5B:
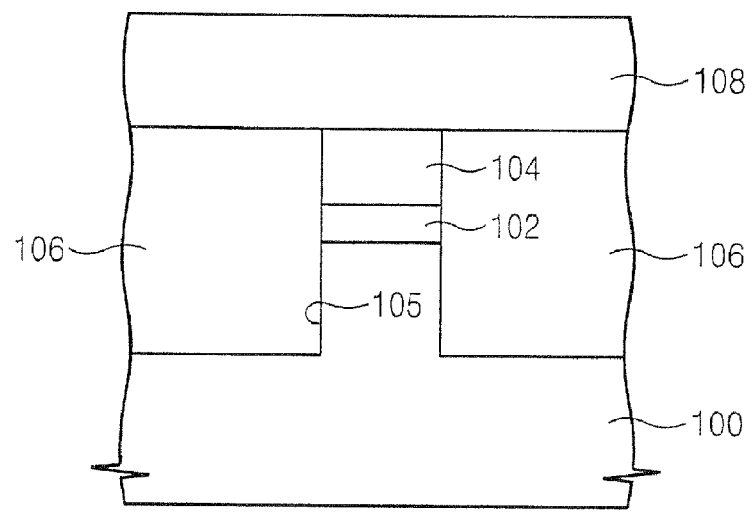

Referring to FIGS. 5A through 5B, a support layer (for forming support pattern 102) and a device active layer (for forming a device active pattern 104) are preferably formed on a substrate 100 sequentially. The substrate 100 may be a silicon substrate, The support layer may be formed of a semiconductor layer having etch selectivity with respect to the substrate 100 and the device active layer, and having a lattice width wider than that of the silicon. The support layer may be formed of a silicon germanium layer. The support layer may be formed on the substrate 100 by means of an epitaxial growth technique using a silicon source gas and a germanium source gas. The device active layer may be formed of strained silicon having a lattice width wider than that of silicon. The device active layer may be formed on the support layer by means of an epitaxial growth technique using a silicon source gas. Therefore, the device active layer may be formed of the strained silicon originated from the support layer.

The device active layer, the support layer and the substrate 100 are successively patterned to form a trench 105 defining an active region. Therefore, a support pattern 102 and a device active pattern 104 are sequentially stacked on the substrate 100. The substrate 100 under the device active pattern 104 may protrude higher than a bottom surface of the trench 105. A device isolation layer 106 is preferably formed to fill the trench 105. The device isolation layer 106 may be formed of a silicon oxide layer such as a high density plasma silicon oxide layer. The trench 105 and the device isolation layer 106 may be formed in a conventional manner, such as by means of a hard mask pattern.

A mold layer 108 is preferably formed over the entire surface of the resultant structure to cover the device active pattern 104 and the device isolation layer 106. The mold layer 108 can be formed of a material layer having etch selectivity with respect to the device isolation layer 106 and the device active pattern 104. For instance, the mold layer 108 may be formed of an organic polymer containing a large amount of carbon. The organic polymer may be a material used as an organic reflect preventing layer. The mold layer 108 may optionally be formed of a silicon nitride layer or a silicon oxynitride layer.

Referring to FIGS. 6A, 6B, 7A, 7B, 8A and 8B, the mold layer 108 is preferably patterned to form a groove 110 crossing over the device active pattern 104. The groove 110 may expose a portion of the device active pattern 104. Both edges of the groove 110 are preferably extended over the device isolation layer 106 to expose a portion of the device isolation layer 106.

Using the mold layer 108 as a mask, impurity ions can be implanted to dope the support pattern 102 under the groove 110. Thus, the doped support pattern 102a can be formed under the groove 110 with non-doped support patterns 102b being formed at both sides of the doped support pattern 102a. The doped support pattern 102a is self-aligned to the groove 110. In this case, the doped support pattern 102a may be controlled to have a width different from a width of the groove 110. For example, the impurity ions may be implanted at an inclining angle, thereby forming the support pattern 102a of which width is different from the width of the groove 110.

Alternatively, before implanting the impurity ions, a sacrificial spacer 111 may be formed on the sidewall of the groove 110, with the impurity ions being implanted to form the doped support pattern 102a having a width narrower than the width of the groove 110. The sacrificial spacer 111 is preferably formed of a material having etch selectivity with respect to the mold layer 108. After the doped support pattern 102a is formed, the sacrificial spacer 111 is removed. In this case, the doped support pattern 102a is formed being self-aligned to the groove 110.

Figure 6A:
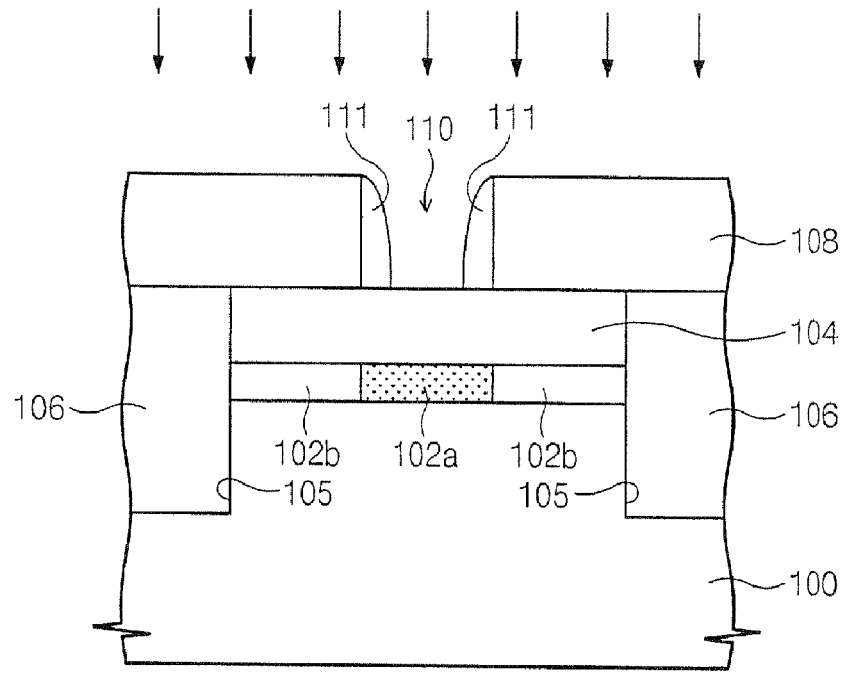
Figure 6B:
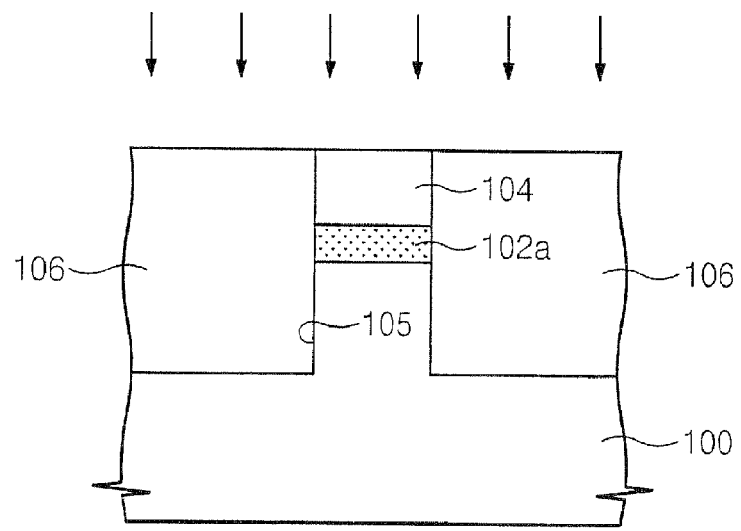
Figure 7A:
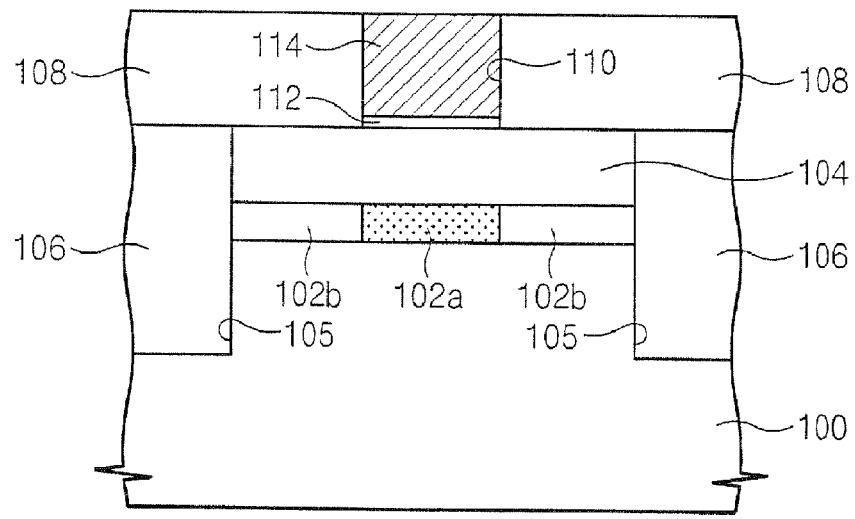
Figure 7B:
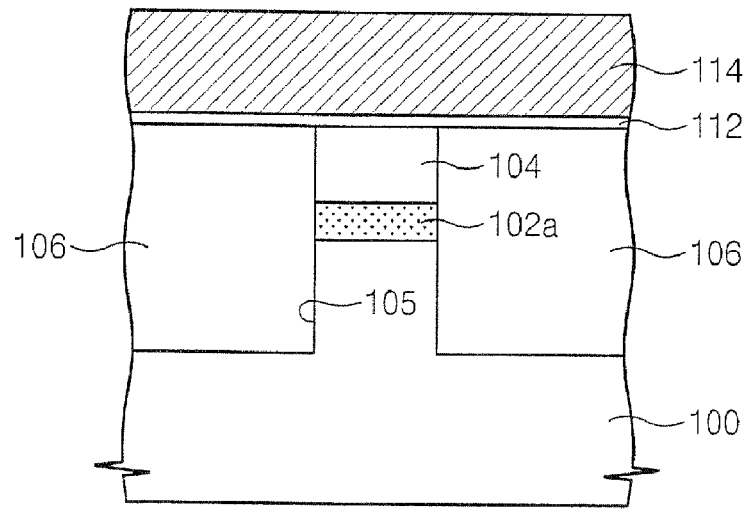
Figure 8A:
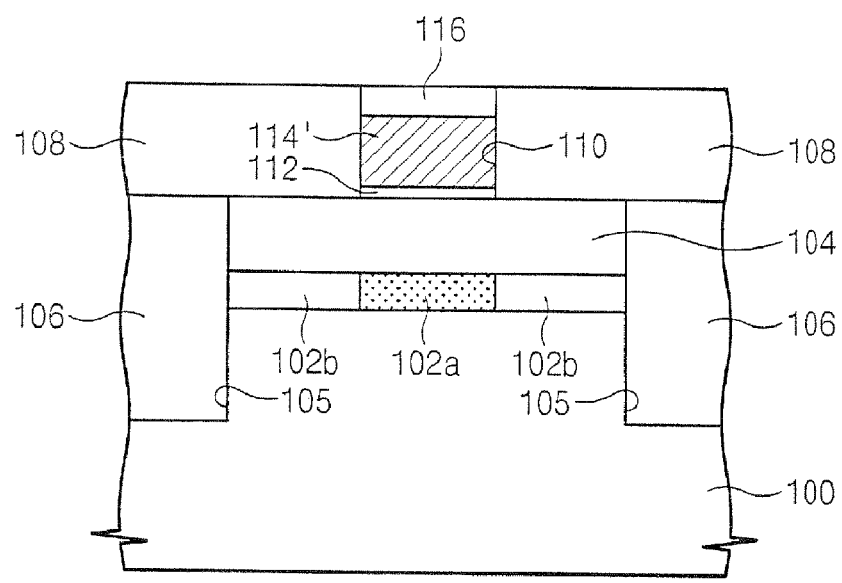
Figure 8B:
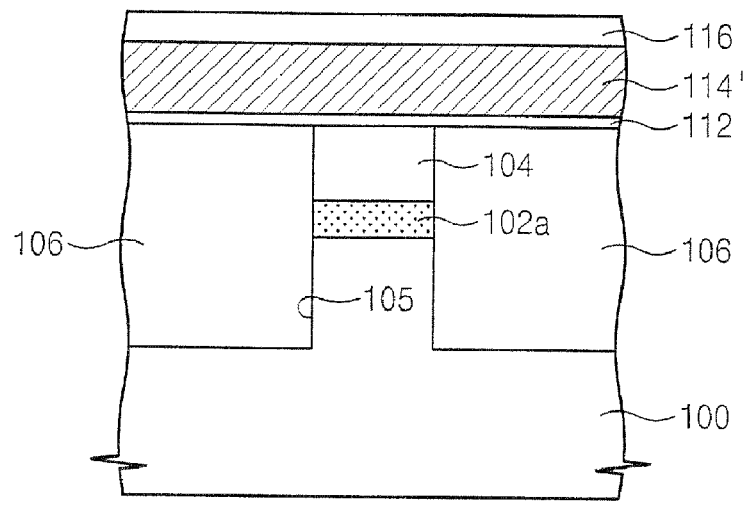
Figure 9A:
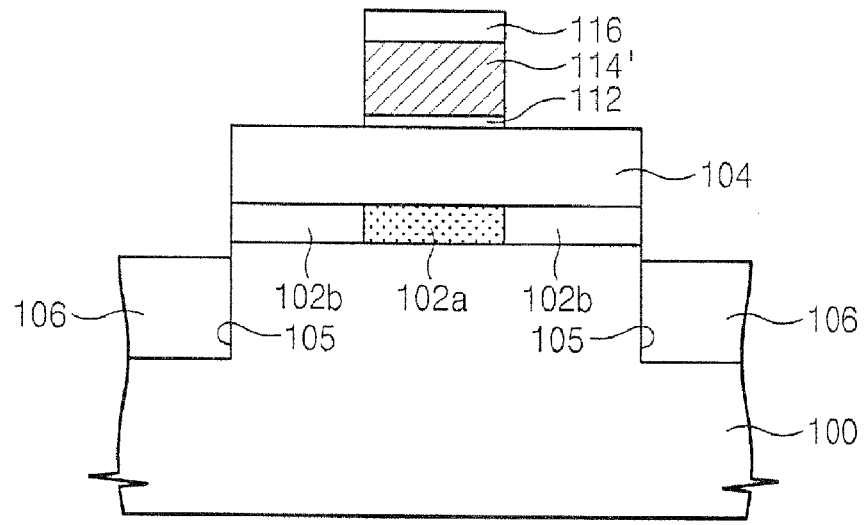
Figure 9B:
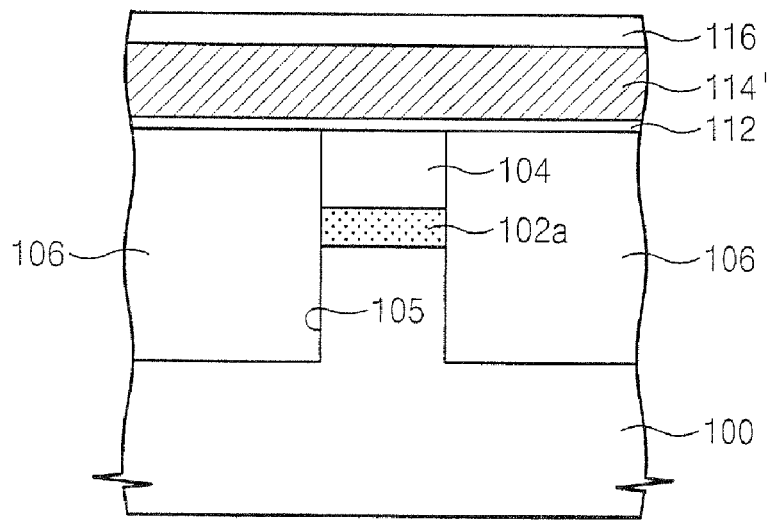

In FIG. 6A, however, the doped support pattern 102a is shown without the sacrificial spacer 111, and without the impurity ions implanted on an incline. For an NMOS transistor, the impurity ions may be p-type. For a PMOS transistor, the impurity ions may be n-type. The impurity ions may control a threshold voltage of the transistor.

Before implanting the impurity ions, a buffer oxide layer may be formed on a surface of the device active pattern 104 exposed by the groove 110 to implant ions. The buffer oxide layer for the ion implantation may be formed before forming the mold layer 108.

A gate insulation layer 112 may be formed on a surface of the device active pattern 104 exposed by the groove 110. If the buffer oxide layer for the ion implantation exists, it may be removed before forming the gate insulation layer 112. The gate insulation layer 112 may be formed of a silicon oxide layer, such as a thermal oxide layer.

A gate conductive layer is preferably formed on an entire surface of the substrate 100 having a gate insulation layer 112, filling the groove 110. The gate conductive layer is then planarized until the mold layer 108 is exposed to form a gate electrode 114. The gate conductive layer may be formed of doped polysilicon or a material containing conductive metal. If the gate conductive layer is formed of doped polysilicon, a selective silicidation process may be applied to a top surface of the gate electrode 114. The selective silicidation process may include depositing a metal layer on the substrate 100 having the gate electrode 114, performing a thermal process to cause the deposited metal layer to react with the gate electrode 114, and removing a non-reacting metal layer. The deposited metal layer may, for example, be formed of nickel, cobalt, titanium or tungsten.

Using the mold layer 108 as a mask, the gate electrode 114 may be recessed. A gate mask layer is preferably formed on an entire surface of the substrate 100 including the recessed gate electrode 114'. The gate mask layer is planarized until the mold layer 108 is exposed, thereby forming a gate mask pattern 116. The gate mask pattern 116 fills the recessed region of the gate electrode 114. The gate mask pattern 116 may be formed, for example, of a silicon nitride layer or a silicon oxynitride layer. The mold layer 108 may be formed of an organic polymer. If the gate mask pattern 116 is omitted, the mold layer 108 may be formed of silicon nitride or silicon oxynitride.

Referring to FIGS. 9A, 9B, 10A and 10B, the mold layer 108 is preferably removed to expose the device isolation layer 106 arranged at both sides of the gate electrode 114'. The exposed device isolation layer 106 is preferably etched by means of a selective anisotropic etch technique, thereby exposing a sidewall of the non-doped support pattern 102b. The exposed device isolation layer 106 may be etched using the gate mask pattern 116 or the gate electrode 114'.

The non-doped support pattern 102b is preferably removed by means of the selective isotropic etch technique. In this case, the doped support pattern 102a may remain unetched to form an undercut region 120 at both sides of the doped support pattern 102a. The non-doped support pattern 102b preferably has etch selectivity with respect to the device active pattern 104 and the substrate 100. In addition, the non-doped support pattern 102b may have etch selectivity with respect to the doped support pattern 102a.

The etch rate of the silicon germanium varies with respect to a concentration of the doped impurities. An experiment demonstrating this is described below. Sample 1, sample 2 and sample 3 are prepared for the experiment. Sample 1 is a double layer of non-doped silicon germanium and silicon that are sequentially stacked on a substrate. Sample 2 is a double layer of silicon germanium implanted with phosphorous having a concentration of 5E12 and silicon. Sample 3 is a double layer of silicon germanium implanted with phosphorous having a concentration of 1E13 and silicon. Sidewalls of the samples are exposed by a predetermined patterning process. The corresponding layers in the samples are formed to have the same thickness.

Samples 1, 2 and 3 are etched for the same time (e.g., 10 minutes) by means of an etch medium containing pure water, phosphorous acid, $CH_3COOH$, and $HNO_3$. The results are as follows the exposed sidewall of the silicon germanium in sample 1 is recessed about 1500 nm laterally from the exposed sidewall of the silicon layer. The exposed sidewall of the silicon germanium layer in sample 2 is recessed about 116 nm laterally from the exposed sidewall of the silicon layer. The exposed sidewall of the silicon germanium layer in sample 3 is recessed about 30 nm laterally from the exposed silicon layer. The etch selectivity ratio of the silicon germanium layers between sample 1 and sample 2 is about 12:1. The etch selectivity ratio of the silicon germanium layers between sample 1 and sample 3 is about 50:1.

The results are similar to the above if the impurity is boron or arsenic. An inert gas such as argon (Ar) may also be used as the impurity. In each instance, the silicon germanium has an etch rate that varies according to the concentration of doped impurities. As the impurity concentration increases, the etch rate may be reduced. Therefore, the non-doped support pattern 102b may be selectively removed, while the doped support pattern 102a is retained.

Referring to FIGS. 11A, 11B, 12A, 12B, 13A and 13B, a thermal oxidation process is preferably applied to the substrate 100 including the undercut region 120 to form a surface insulation layer 122. The surface insulation layer 122 is thereby preferably formed on inner sidewalls of the undercut region 120. Using the gate electrode 114' as a mask, the source/drain impurity ions are preferably implanted to form a first doped layer 124.

A conformal spacer layer 126 is then preferably formed on the substrate 100 including the first doped layer 124. The spacer layer 126 may be formed by means of a CVD or an ALD technique having good step coverage. A portion of the spacer layer 126 may be formed in the undercut region 120. The spacer layer 126 may be an insulation layer such as a silicon oxide layer, a silicon nitride layer, or a silicon oxynitride layer, for example.

The spacer layer 126 is preferably etched by means of an anisotropic etch technique, thereby forming a gate spacer 126a on both sidewalls of the gate electrode 114'. A residual spacer 126b may be formed on sidewalls of the trench 105 exposed by the recessed device isolation layer 106.

The insulation materials formed in the undercut region 120 is defined as a filling insulation pattern 130. The filling insulation pattern 130 includes a portion of the surface insulation layer 122. The filling insulation pattern 130 may include a portion of the spacer layer 126. That is, the filling insulation pattern 130 may contain the same material as the gate spacer 126a. In addition, the filling insulation pattern 130 may include a vacancy. In other words, the undercut region 130 need not be filled in with the insulation material entirely but may be vacant. The first doped layer 124 may be formed to contact the filling insulation pattern 130.

Using the gate electrode 114' and the gate spacer 126a as a mask, second source/drain impurity ions are preferably implanted to form a second doped layer 132. A dose of the second source/drain impurity ions is preferably larger than or similar to that of the first source/drain impurity ions. The first and second doped layers 124 and 132 compose source/drain regions 135. The source/drain regions 135 may be formed to contact the filling insulation pattern 130. The insulation layer 140 (shown in FIGS. 1 through 3) is preferably formed over the entire surface of the resultant structure to form the semiconductor device.

According to the above method of forming a semiconductor device, the filling insulation pattern 130 is preferably formed under the source/drain regions 135. Therefore, a leakage current of the source/drain regions 135 may be reduced and a punch through characteristic between the source/drain regions 135 can be drastically improved.

In addition, the channel region under the gate electrode 114' is preferably formed of the strained silicon originated from the support pattern 102. Mobility of the carriers is thereby improved to increase a turn-on current of the transistor.

Furthermore, a portion of the support pattern 102 is preferably doped to provide etch selectivity between the doped support pattern 102a and the non-doped support pattern 102b. The undercut region 120 is thereby more easily formed. Moreover, the groove 110 formed in the mold layer 108 self-aligns the gate electrode 114' with the doped support pattern 102a. Therefore, the channel region formed of the strained silicon and the gate electrode 114' can be arranged with ease. And, accordingly, a high-rate of operation can be achieved in a highly integrated semiconductor device.

Figure 14:
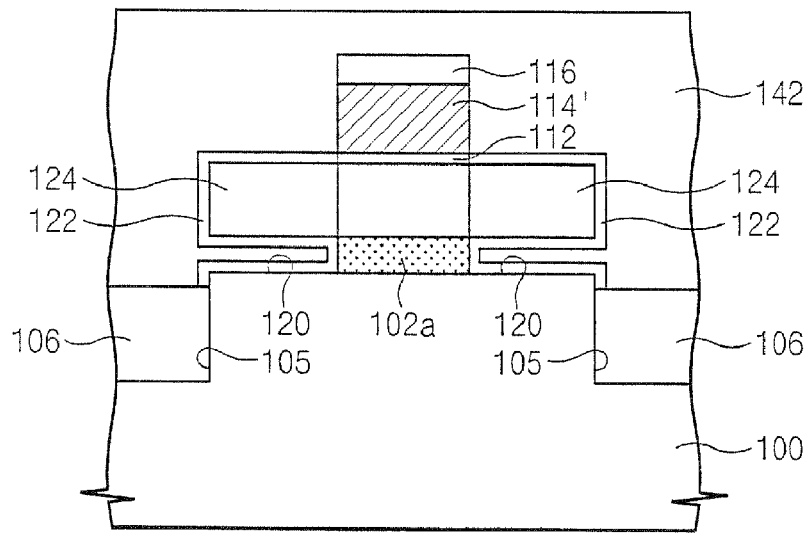
FIGS. 14 and 15 are cross-sectional views of the semiconductor device of FIG. 1, taken along line I-I', illustrating a method of forming the semiconductor device shown in FIG. 4 according to an alternate embodiment of the present invention.
Figure 15:
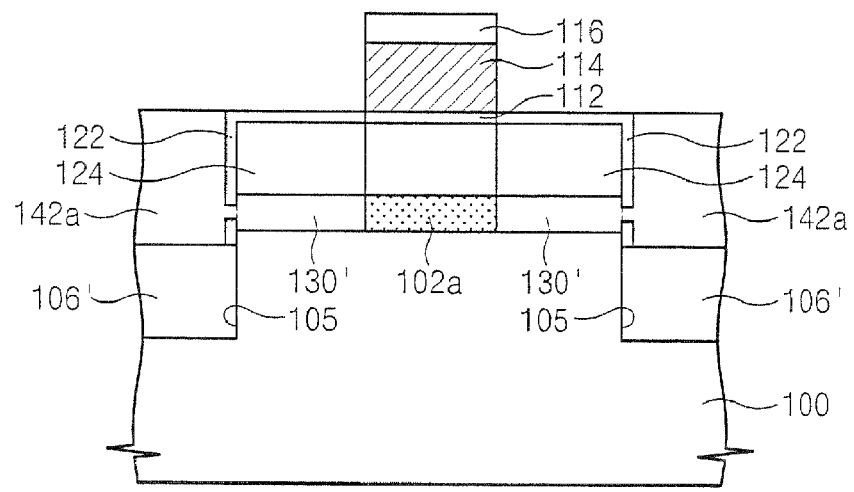

A method of forming the semiconductor device shown in FIG. 4 will now be explained with reference to FIGS. 14 and 15. FIGS. 14 and 15 are cross-sectional views taken along a line I-I' in FIG. 1, illustrating a method of forming the semiconductor device shown in FIG. 4.

Figure 10A:
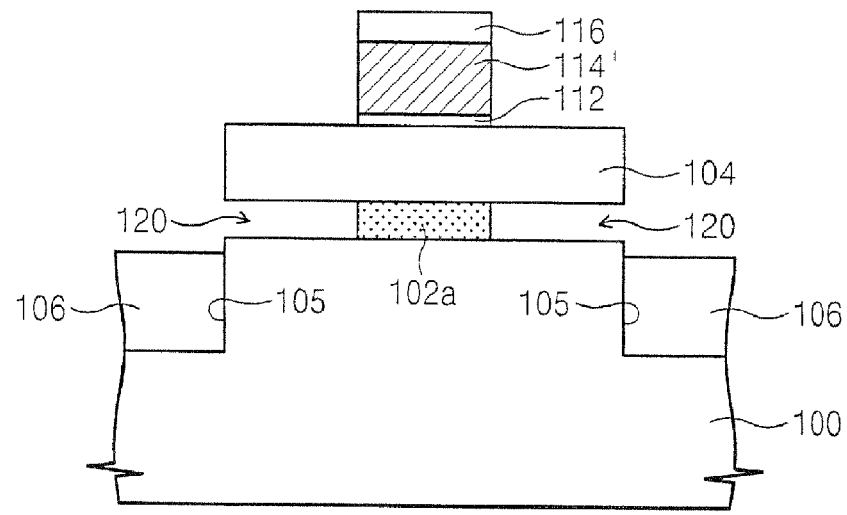
Figure 10B:
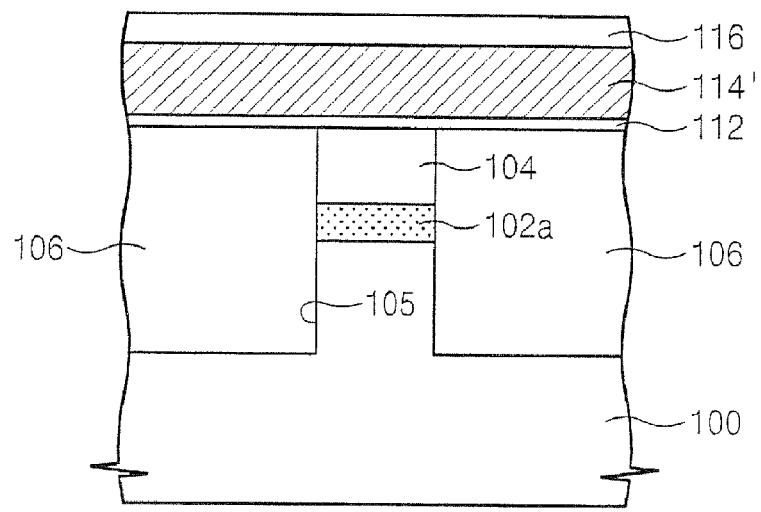
Figure 11A:
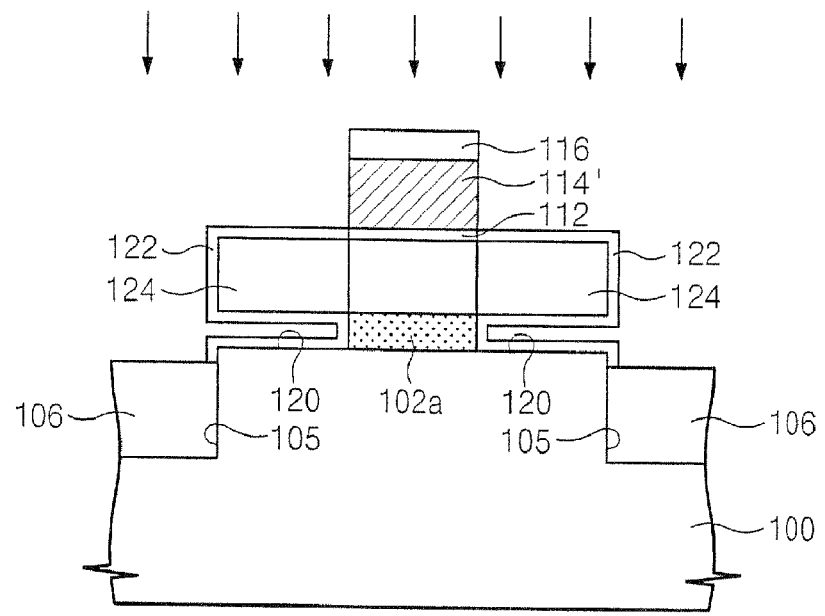
Figure 11B:
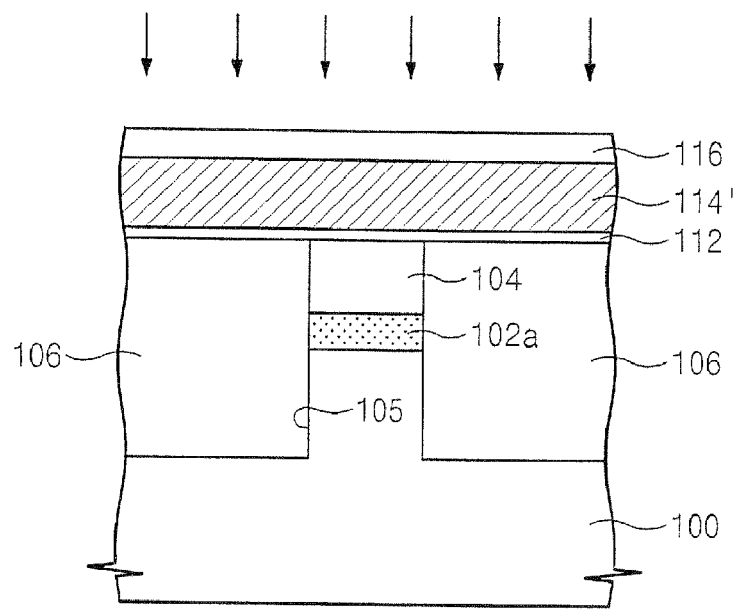
Figure 12A:
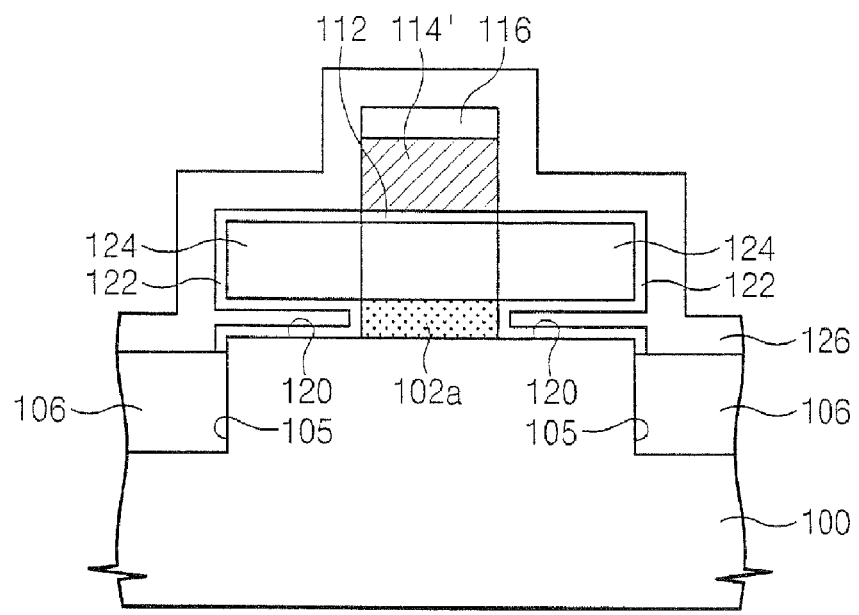
Figure 12B:
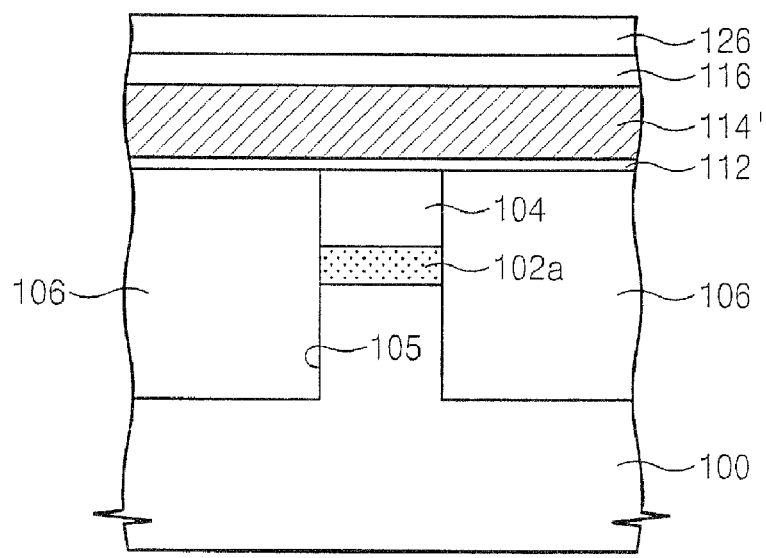
Figure 13A:
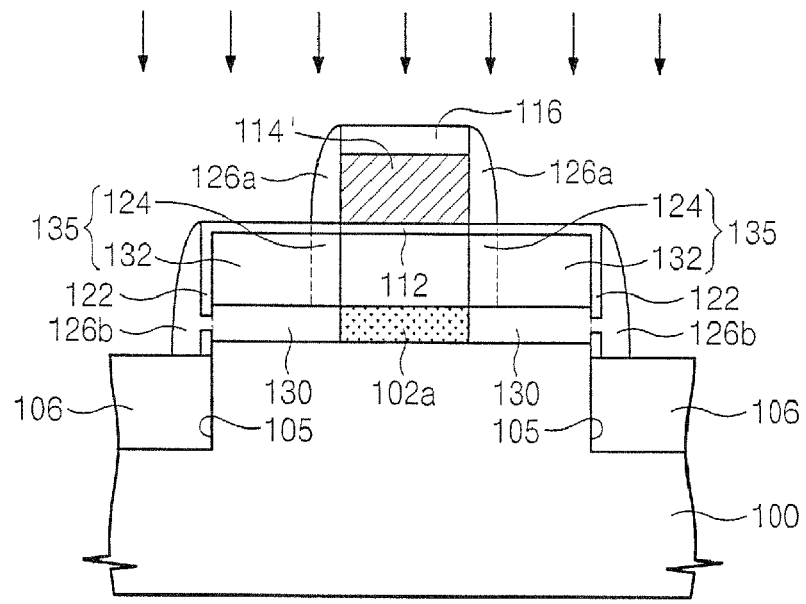
Figure 13B:
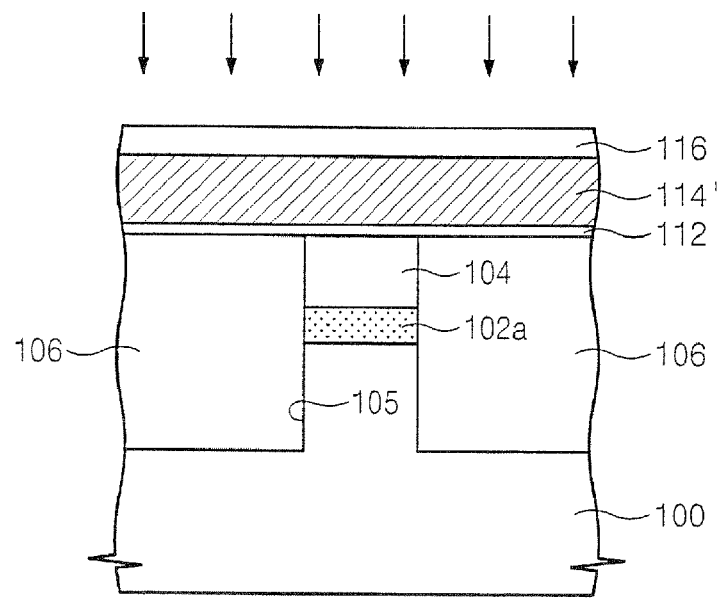

Referring to FIGS. 14 and 15, the method of forming an undercut region 120 and a surface insulation layer 122 in this embodiment is preferably the same as described with reference to FIGS. 10A and 10B. A supplementary filling layer 142, however, is preferably formed on an entire surface of the structure having the surface insulation layer 122. The supplementary filling layer 142 may be an insulation layer having good gap fill and planarization characteristics. In addition, the supplementary filling layer 142 may have etch selectivity with respect to the gate electrode 114' (or the gate mask pattern 116). For instance, the supplementary filling layer 142 may be formed of SOG. The supplementary filling layer 142 preferably fills the recessed region of the device isolation layer 106 so as to form the under cut region 120.

The supplementary filling layer 142 is preferably etched back until the surface insulation layer 122 or a device active pattern 104 is exposed, thereby forming a supplementary filling pattern 142a. A gate spacer 126a is formed on both sidewalls of the gate electrode 114'. Second source/drain impurity ions can be implanted to form a second doped layer 132. An interlayer insulation layer 140' is preferably formed on the entire surface of the resultant structure to form the semiconductor device shown in FIG. 4. With the supplementary filling layer 142 formed in the undercut region 120, the filling insulation pattern 130' in FIG. 4 may contain the same material as the supplementary filling pattern 142a.

Alternative Embodiment

Figure 16:
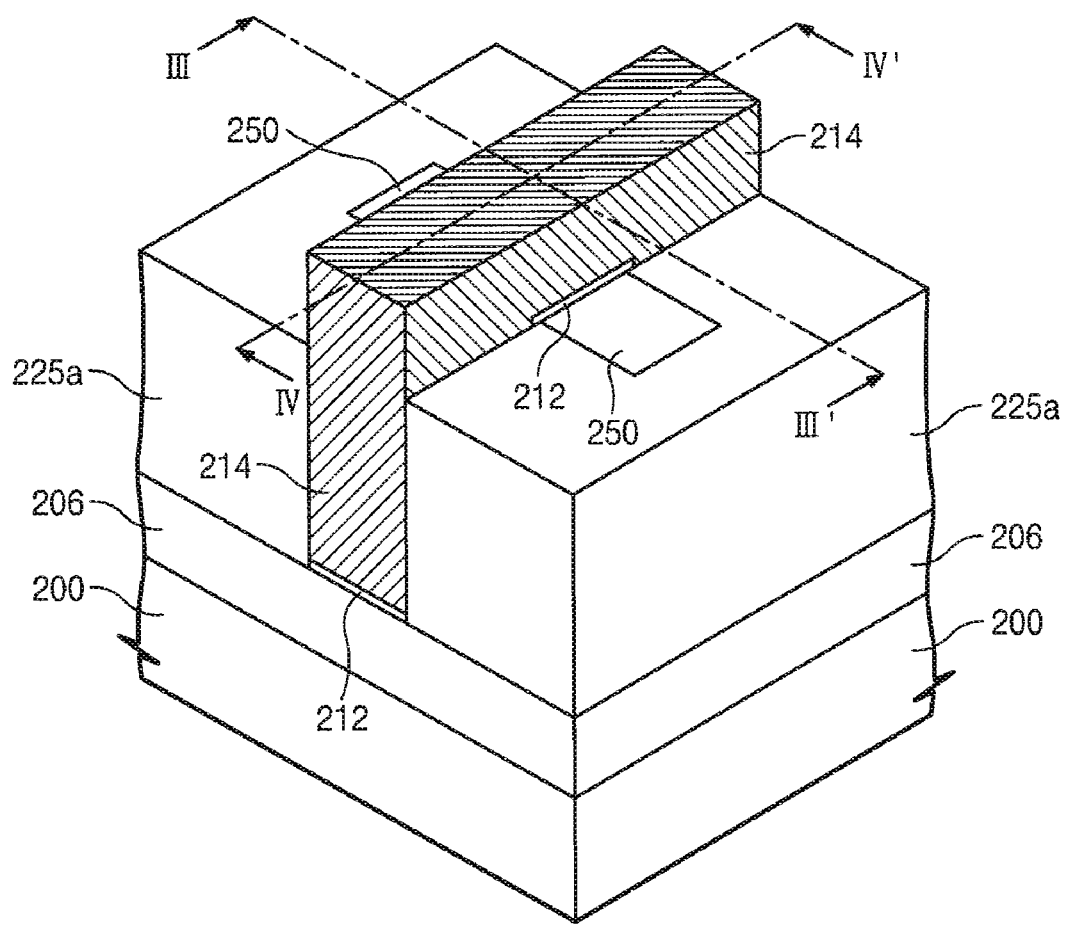
FIG. 16 is a perspective view of a semiconductor device in accordance with another exemplary embodiment of the present invention.
Figure 17:
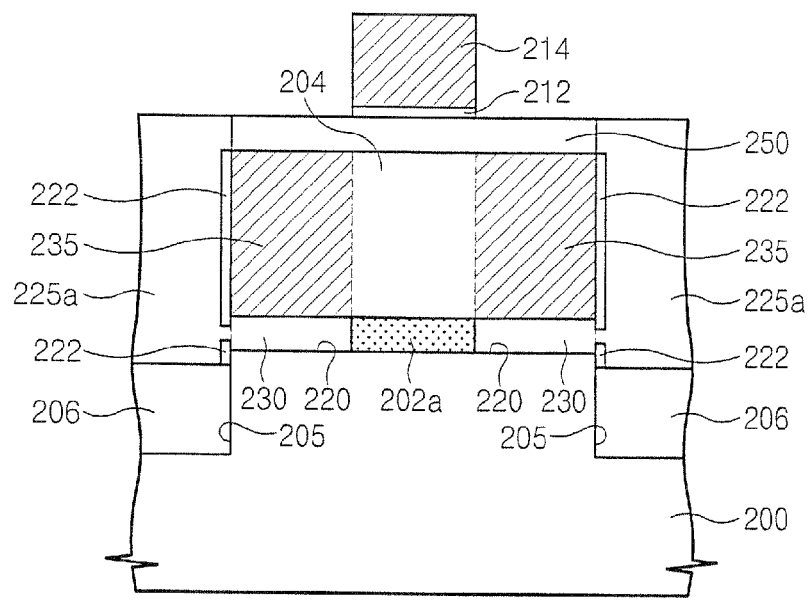
FIG. 17 is a cross-sectional view of the semiconductor device of FIG. 16, taken along line III-III'.
Figure 18:
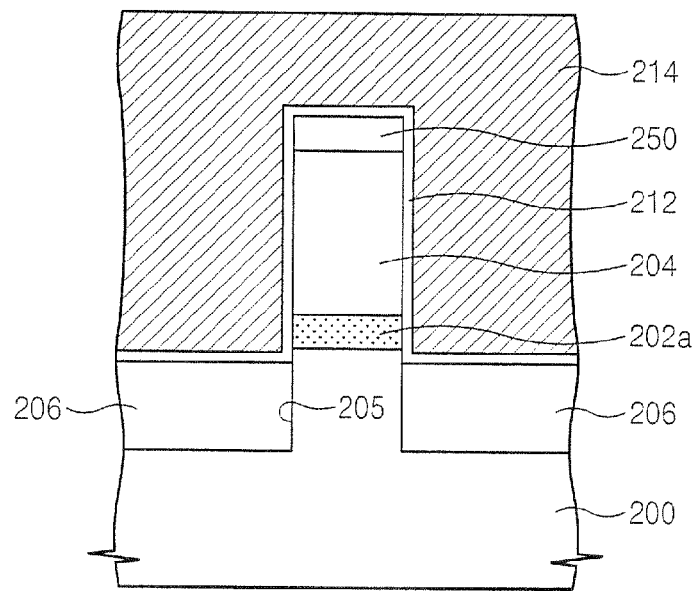
FIG. 18 is a cross-sectional view of the semiconductor device of FIG. 16, taken along line IV-IV'.

An alternative embodiment of the present invention will now be described. Specifically, FIG. 16 is a perspective view of a semiconductor device in accordance with another exemplary embodiment of the present invention. FIG. 17 is a cross-sectional view of the semiconductor device, taken along a line III-III' in FIG. 16. FIG. 18 is a cross-sectional view of the semiconductor device, taken along a line IV-IV' in FIG. 16.

Referring to FIGS. 16, 17 and 18, a device active pattern 204 is disposed on a substrate 200. The device active pattern 204 preferably has a vertically-extending fin-shaped structure. A doped support pattern 202a is preferably interposed between a portion of the device active pattern 204 and the substrate 200. A filling insulation pattern 230 is arranged at both sides of the doped support pattern 202a. The filling insulation pattern 230 is disposed in the undercut region 220 at both sides of the doped support pattern 202a. The undercut region 220 is surrounded by the sidewall of the doped support pattern 202a, the substrate 200, and a portion of bottom surface of the device active pattern 204. The filling insulation pattern 230 is disposed between the filling insulation pattern 230, the device isolation pattern 204, and the substrate 200.

The substrate 200 may be a silicon substrate. The doped support pattern 202a is preferably formed of semiconductor material having etch selectivity with respect to the substrate 200 and the device active pattern 204 and further preferably has a lattice width wider than that of the silicon.

In addition, the doped support pattern 202a may, for example, be doped with predetermined impurities. The doped support pattern 202a may be a doped silicon germanium layer. The device active pattern 204 may be a silicon layer. In particular, the device active pattern 204 disposed on the doped support pattern 202a may be a strained silicon layer having a lattice width wider than that of general silicon. The strained silicon may be maintained in a strained state by the doped support pattern 202a. The filling insulation pattern 230 may be formed of insulation material. The filling insulation pattern 230 may include a vacancy therein.

A trench 205 defining the device active pattern 204 preferably surrounds the patterns 204, 202a, and 230. The bottom surface of the trench 205 comprises the substrate 200. A top surface of the substrate 200 disposed under the device active pattern 204 may protrude higher than the bottom surface of the trench 205. The device isolation layer 206 may fill a portion of the trench 205. A top surface of the device isolation layer 206 is preferably disposed under the filling insulation pattern 230.

The gate electrode 214 preferably crosses over the device active pattern 204. In particular, the gate electrode 214 may wrap over the top surface and both sidewalls of the device active pattern 204 located on the doped support pattern 202a. The device active pattern 204 under the gate electrode is preferably formed of the strained silicon layer. A gate insulation layer 212 preferably intervenes between the gate electrode 214 and the device active pattern 204. The doped support pattern 202a may have the same width as the gate electrode 214. Alternatively, the doped support pattern 202a may have a width different from that of the gate electrode 214.

A capping pattern 250 may intervene between a top surface of the device active pattern 204 and the gate electrode 214. The capping pattern 250 may be thicker than the gate insulation layer 212. Therefore, a channel need not be formed in the top surface of the device active pattern 204 disposed under the gate electrode 214. The capping pattern 250 may extend to a top surface of the device active pattern 204 at both sides of the gate electrode 214. The capping pattern 250 may contact a top surface of the device active pattern 204. The capping pattern 250 is preferably formed of an insulation layer. The capping pattern 250 may, for example, be formed of a silicon oxide layer, a silicon nitride layer, or a silicon oxynitride layer. Alternatively, the capping pattern 250 may be omitted. If the capping pattern 250 is provided, the channel region preferably includes both sidewalls of the device active pattern 204. If the capping pattern 250 is omitted, the channel region under the gate electrode 214 may include a top surface and both sidewalls of the device active pattern 204.

Source/drain regions 235 are preferably formed in the device active pattern 204 at both sides of the gate electrode 214. A bottom surface of the source/drain regions 235 may contact the filling insulation pattern 230. The source/drain regions 235 are impurity doped layers implanted with impurities of a type different from that of the doped support pattern 202a. for instance, if the source/drain regions 235 are doped with p-type impurities, the doped support pattern 202a is doped with n-type impurities. On the other hand, if the source/drain regions 235 are doped with n-type impurities, the doped support pattern 202a is doped with p-type impurities.

In the embodiment shown in FIG. 18, the gate electrodes 214 are also placed on sidewalls of the doped support pattern 202a. The channel region, however, is not formed in the doped support pattern 202a. Since the filling insulation pattern 230 is disposed at both sides of the doped support pattern 202a, the source/drain regions 235 are not formed.

As shown in FIG. 17, a surface insulation layer 222 may be disposed along sidewalls of the device active pattern 204 at both sides of the gate electrode 214. If the capping pattern 250 is not formed, the surface insulation layer 222 may extend to the top surface of the device active pattern 204 at both sides of the gate electrode 214. The filling insulation pattern 230 may contain the same material as the surface insulation layer 222.

A supplementary filling pattern 225a may be disposed on the device isolation layer 206 to fill the trench 205. The filling insulation pattern 230 may contain the same material as the supplementary filling pattern 225a. The supplementary filling pattern 225a may be omitted. If the supplementary filling pattern 225a is omitted, the trench 205 may be filled with an interlayer insulation layer. The interlayer insulation layer may contain the same material as the filling insulation pattern 230.

As in the first embodiment, a gate mask pattern may be disposed on the top surface of the gate electrode 214. In addition, a gate spacer may be disposed on both sidewalls of the gate electrode 214. In this case, the filling insulation pattern 230 may contain the same material as the gate spacer. The gate mask pattern and the gate spacer may be formed of the same material as the gate mask pattern 116 and the gate spacer 126a, respectively, in the first exemplary embodiment.

In the semiconductor device of this embodiment, the filling insulation pattern 230 is preferably disposed under the source/drain regions 235. Therefore, the junction leakage current of the source/drain region 235 can be reduced and a punch through characteristic between the source/drain regions 235 can be improved. Moreover, the channel region under the gate electrode 214 preferably is formed of the strained silicon, thereby improving a mobility of carriers to increase a turn-on current of the transistor. That is, the transistor can be configured to increase the turn-on current within a constricted area. Accordingly, a semiconductor device constructed in this manner can provide a high operation rate with a high integration density.

In addition, the gate electrode 214 is preferably controlled at both sides of the channel region. A control ability of the gate electrode may therefore be improved with respect to the channel region. And by connecting the device active pattern 204 to the substrate 200 through the doped support pattern 202a, an immobility effect can be prevented and heat resulting from device operations can be effectively emitted.

FIGS. 19A through 22A are cross-sectional views of the semiconductor device of the previously described embodiment, taken along line III-III' in FIG. 16, illustrating a method of forming the semiconductor device shown in FIG. 16 in accordance with another embodiment of the present invention. FIGS. 20B through 22B are cross-sectional views taken along line IV-IV' in FIG. 16, further illustrating the method of forming the semiconductor device in accordance with this embodiment.

Figure 19A:
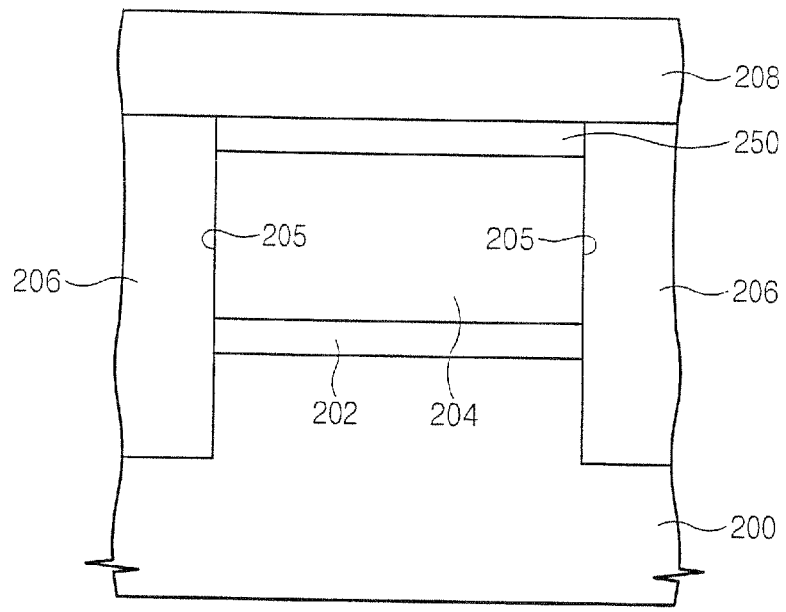
Figure 19B:
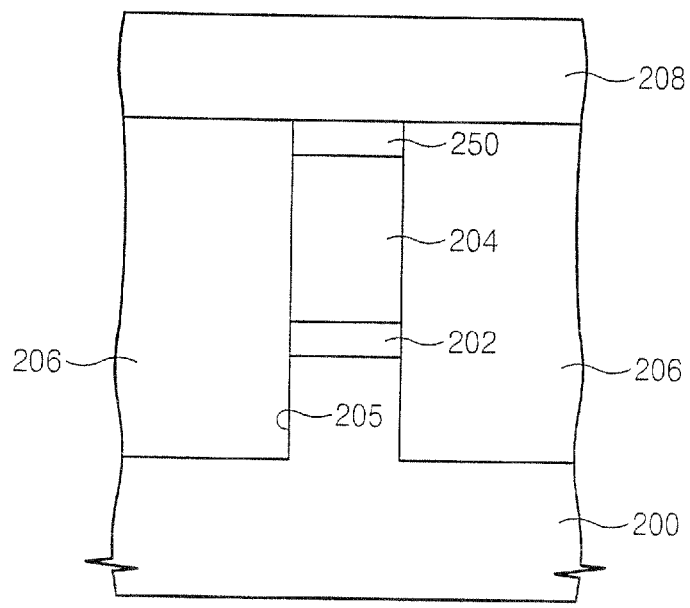
Figure 20A:
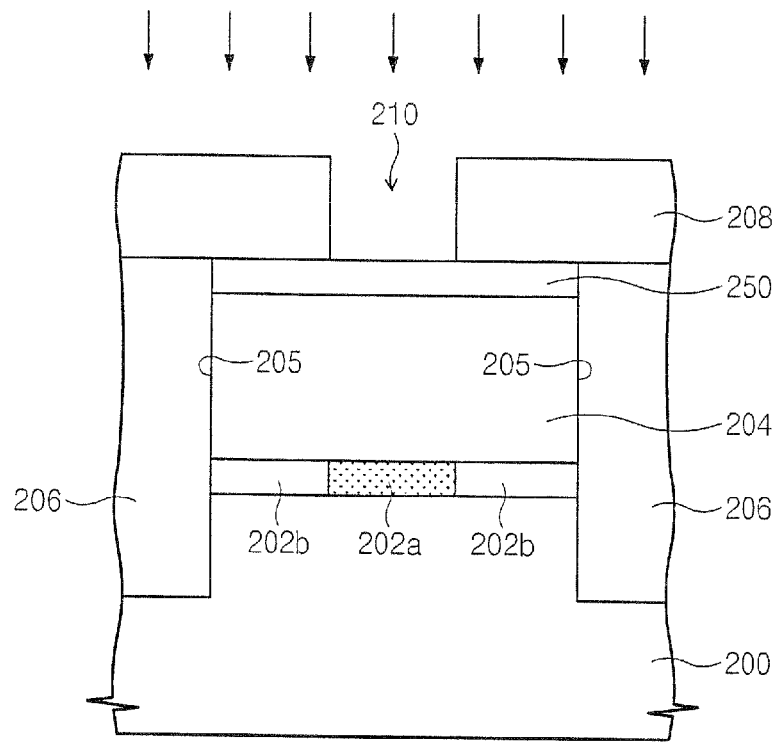
Figure 20B:
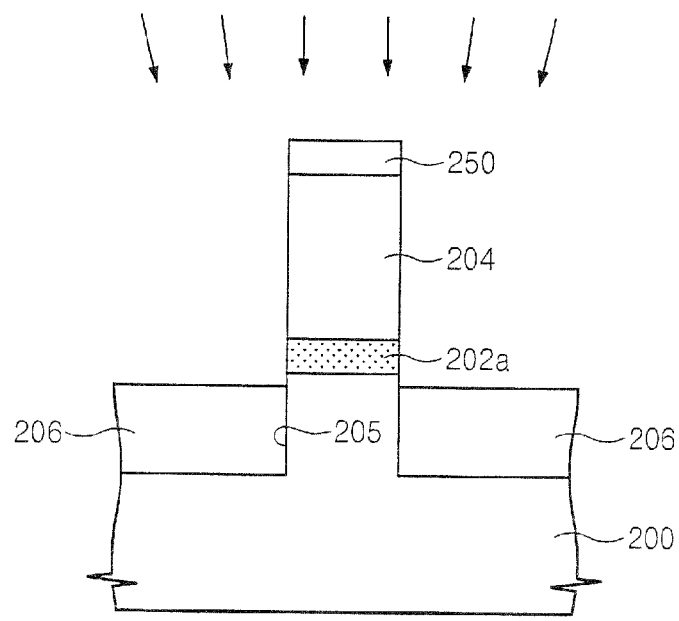
Figure 21A:
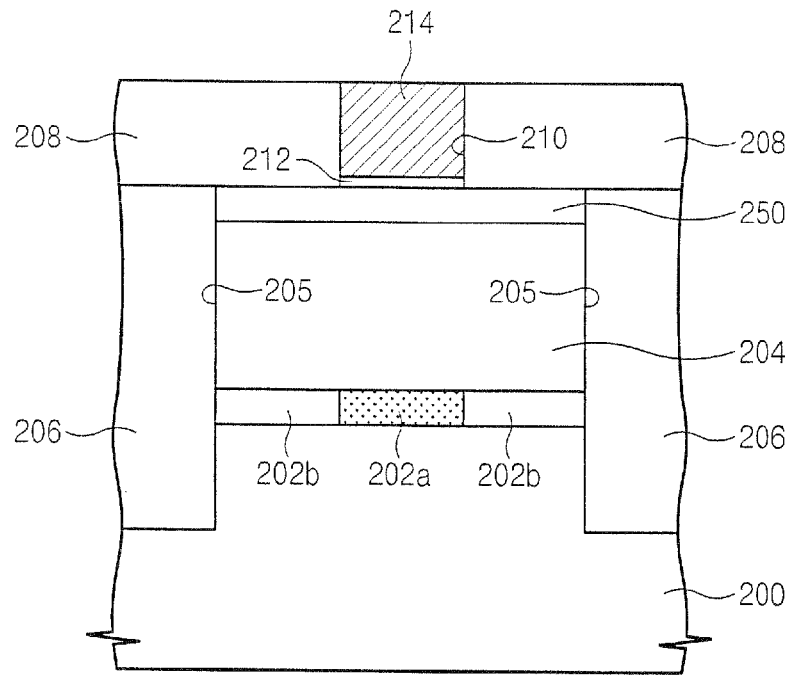
Figure 21B:
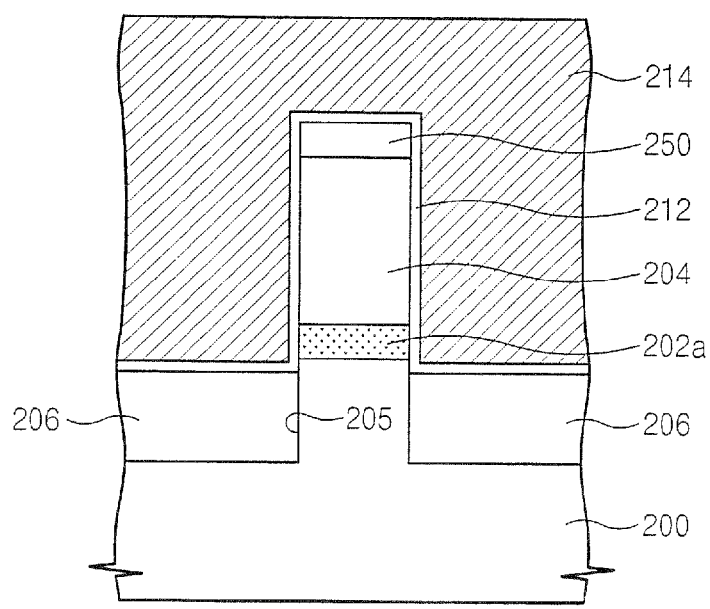

Referring to FIGS. 19A and 19B, a support layer, a device active layer, and a capping layer are preferably sequentially formed on a substrate 200. The support layer is preferably formed of a semiconductor material having etch selectivity with respect to the substrate 200 and the device active layer and further having a lattice width wider than that of silicon. The support layer may be formed by means of an epitaxial growth technique using a silicon source gas and a germanium source gas. The device active layer may be formed on the support layer by means of an epitaxial growth technique using a silicon source gas. The support layer is therefore preferably formed of silicon germanium, and the device active layer is preferably formed of strained silicon originated from the support layer. The capping layer is preferably an insulation layer and may be a silicon oxide layer, a silicon nitride layer, or a silicon oxynitride layer, for example.

The capping layer, the device active layer, the support layer, and the substrate 200 are thereafter successively patterned to form a trench 205 defining the active region. A support pattern 202, a device active pattern 204, and a capping pattern 250 are preferably sequentially formed in the active region. The device active pattern 204 is preferably formed having a vertically-extending fin-shape. The capping pattern 250 may be omitted. A device isolation layer 206 is preferably formed to fill the trench 205.

A mold layer 208 is then preferably formed over the entire surface of the substrate to cover the capping pattern 250 and the device isolation layer 206. The mold layer 208 is preferably a material layer having etch selectivity with respect to the device isolation layer 206 and the capping pattern 250. For instance, the mold layer 208 may be formed of an organic polymer containing carbon. Alternatively, the mold layer 208 may be formed of silicon nitride or silicon oxynitride.

Referring to FIGS. 20A, 20B, 21A and 21B, the mold layer 208 is preferably patterned to form a groove 210 crossing over the capping pattern 250. The groove is then extended to expose a portion of the device isolation layer 206. Using the mold layer 208 as a mask, the exposed device isolation layer 206 is preferably etched by means of an anisotropic etch technique to expose both sidewalls of the device isolation pattern 204 under the groove 210. Using the mold layer 208 as a mask, impurity ions are also preferably implanted to dope the support pattern 202 under the groove 210. A doped support pattern 202a is thereby formed under the groove 210. A non-doped support pattern 202b is preferably located under the mold layer 208. Alternatively, both sidewalls of the device active pattern 204 may be exposed by etching the exposed device isolation layer 206 after a portion of the support pattern 202 is doped. As illustrated, the impurity ions may be implanted in an inclined manner.

A width of the doped support pattern 202a can be controlled as in the above first-described embodiment of the present invention. That is, a width of the doped support pattern is capable of being controlled by implanting the impurity ions in an inclined manner. In this case, the impurity ions are preferably implanted at an angle inclined in a direction of the groove 210. The sacrificial spacer 111 in FIG. 6A is preferably formed on inner sidewalls of the groove 210. The impurity ions are then implanted to control the width of the doped support pattern 202a. In this case, the sacrificial spacer 111 is preferably removed after the impurity ions are implanted.

A gate insulation layer 212 can be formed in the groove 210. The gate insulation layer 212 is preferably formed on at least both sidewalls of the exposed device active pattern 204. If the capping pattern 250 is omitted, the gate insulation layer 212 is also preferably formed on the top surface of the device active pattern 204 exposed in the groove 210. The gate insulation layer 212 may be formed of thermal oxide.

A gate electrode 214 is then formed to fill the groove 210 and the anisotropically etched region of the device isolation layer 206. The gate electrode 214 surrounds the top surface and both sidewalls of the device active pattern 204 under the groove 210. Therefore, if the capping pattern 250 exists, a channel region under the gate electrode 214 may comprise both sidewalls of the device active pattern 204. If the capping pattern 250 is omitted, the channel region may comprise both sidewalls and a top surface of the device active pattern 204. As illustrated in the first embodiment, the gate electrode 214 may be selectively recessed and a gate mask pattern may be formed to fill the recessed region of the gate electrode 214 in the groove 210.

Figure 22A:
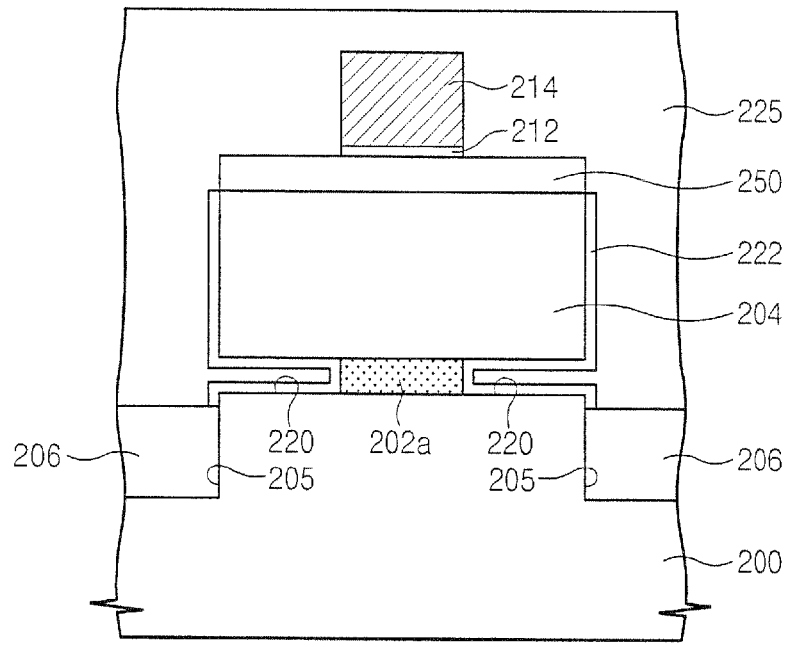
Figure 22B:
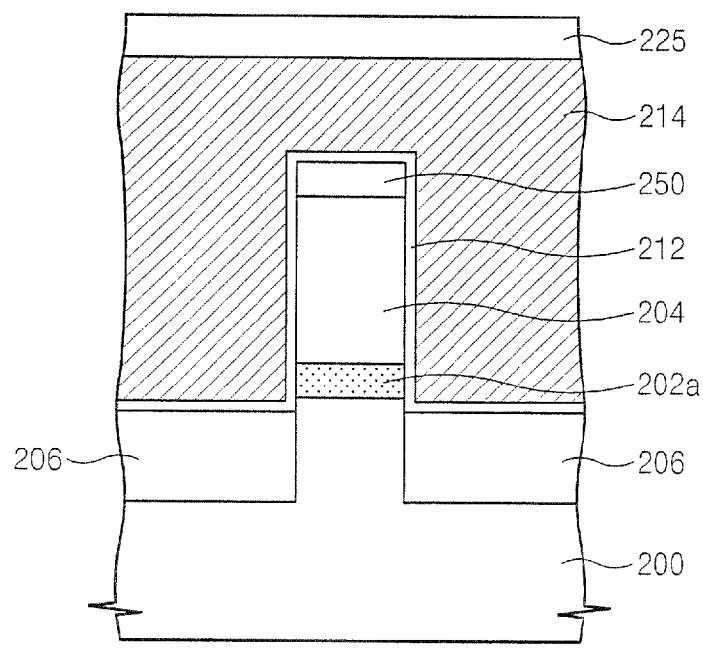

Referring to FIGS. 17, 22A and 22B, the mold layer 208 is preferably removed to expose the device isolation layer 206 at both sides of the gate electrode 214. The exposed device isolation layer 206 is then preferably selectively recessed to expose a sidewall of the non-doped support pattern 202b. The exposed non-doped support pattern 202b is selectively removed by means of a selective isotropic etch technique, thereby forming an undercut region 220. The doped support pattern 202a has etch selectivity with respect to the non-doped support pattern 202b, such that the non-doped support pattern 202b may be selectively removed. Therefore, the undercut region 220 may be easily defined.

A thermal oxidation process is applied to the substrate 200 including the undercut region 220, thereby forming a surface insulation layer 222. In this case, a portion of the surface insulation layer 222 may fill a portion of the undercut region 220. A portion of the surface insulation layer 222 may fill the undercut region 220 entirely. The insulation material formed in the undercut region 220 corresponds to the filling insulation pattern 230 in FIG. 17. That is, the filling insulation pattern 230 may contain the same material as the surface insulation layer 222. The filling insulation pattern 230 may include a vacancy.

A supplementary filling layer 225 is preferably formed on an entire surface of the structure. The supplementary filling layer 225 may be formed of insulation material having good gap-fill and planarization characteristics. For example, the supplementary filling layer 225 may be formed of SOG. A portion of the supplementary filling layer 225 may be formed in the undercut region 220. The filling insulation pattern 230 may therefore contain the same material as the supplementary filling layer 225.

The supplementary filling layer 225 is preferably etched back until the capping pattern 250 is exposed to form a supplementary filling pattern 225a (as shown in FIG. 17). Using the gate electrode 214 as a mask, the source/drain impurity ions are implanted to form the source/drain regions 235 (see FIG. 17) in the device active pattern 204 at both sides of the gate electrode 214. The source/drain region 235 may contact the filling insulation pattern 230. The source/drain region 235 may be formed before forming the supplementary filling layer 225. That is, the surface insulation layer 222 may be formed before the source/drain regions 235 are formed. Afterwards, the supplementary filling layer 225 may be formed.

Before forming the supplementary filling layer 225, a gate spacer may be formed on sidewalls of the gate electrode 214 as illustrate in the first embodiment. The filling insulation pattern 230 may contain the same material as the gate spacers. As in the first embodiment, using the gate spacer, the source/drain region 235 may be formed to have an LDD structure or a structure having an extended region. If the gate spacer is formed, the step of forming the supplementary filling insulation layer 225 may be omitted.

In the method described with respect to this embodiment, the filing insulation pattern 230 is preferably formed under the source/drain regions 235. Therefore, a junction leakage current of the source/drain region 235 can be reduced and a punch-through characteristic can be improved. The channel region under the gate electrode 214 is preferably formed of the strained silicon, such that a turn-on current of the transistor is increased. Thus, a high operation rate semiconductor device can be obtained.

Moreover, a portion of the support pattern 202 is preferably doped to provide etch selectivity between the doped support pattern 202a and the non-doped support pattern 202b. Therefore, the undercut region 220 may be formed with ease. The channel region comprising the gate electrode 214 and the strained silicon may be self-aligned using the groove 210. The channel region preferably comprises both sidewalls of the device active pattern 204, or both sidewalls and the top surface, such that a turn-on current can be increased.

The corresponding composition elements of the above embodiments may be formed of the same materials.

According to various aspects of the present invention, therefore, a filling insulation pattern can be formed under the source/drain regions. The junction leakage current of the source/drain region can thereby be prevented and a punch through characteristic may be improved. The device active pattern having the source/drain regions may be connected to a substrate through a doped portion of the support pattern, such that an immobility effect can be prevented and heat generated by transistor operations can be effectively emitted.

In addition, a channel region under the gate electrode can be formed of strained silicon having a lattice width wider than the silicon. A turn-on current of the transistor can thereby be increased to provide a semiconductor device having a high operation rate.

A portion of the support pattern can also be doped to provide etch selectivity between the doped portion and the non-doped portion, thereby permitting formation of an undercut region where the filling insulation pattern can be easily formed.

Moreover, the doped portions of the gate electrode and the support pattern can be self-aligned, thereby providing ready alignment between the gate electrode and the channel region formed with the strained silicon. As a result of the foregoing inventive concepts, a highly integrated and high-speed semiconductor device can be provided.

Although the present invention has been described in connection with the various embodiments illustrated in the accompanying drawings, it is not limited thereto. It will be apparent to those skilled in the art that various substitutions, modifications and/or changes may be made thereto without departing from the scope and spirit of the invention.

What is claimed is:

1. A method of forming a semiconductor device, comprising:
  sequentially stacking a support pattern and a device active pattern on a substrate;
  doping a portion of the support pattern;

forming a gate electrode crossing over the device active pattern, being interposed by a gate insulation layer, said gate electrode being disposed on the doped portion of the support pattern;

forming an undercut region by removing a non-doped portion of the support pattern;

forming a filling insulation pattern in the undercut region; and forming a source/drain region in the device active pattern at both sides of the gate electrode, wherein the device active pattern under the gate electrode is formed of a strained silicon having a lattice width wider than a silicon lattice width.

2. The method of forming a semiconductor device according to claim 1, further comprising forming a device isolation layer surrounding sidewalls of the support pattern and the device active pattern before forming the gate electrode, and wherein the forming of the undercut region comprises:

exposing the sidewall of the non-doped portion of the support pattern by recessing a portion of the device isolation layer; and forming the undercut region by removing the non-doped portion of the support pattern.

3. The method of forming a semiconductor device according to claim 2, wherein doping a portion of the support pattern and forming the gate electrode comprises:

forming a mold layer covering the device active pattern and the device isolation layer, the mold layer having a groove crossing over the device active pattern;

doping a portion of the support pattern by implanting impurity ions using the mold layer as a mask;

forming a gate electrode filling the groove; and removing the mold layer.

4. The method of forming a semiconductor device according to claim 2, wherein doping a portion of the support pattern and forming the gate electrode, comprises:

forming a mold layer covering the device active pattern and the device isolation layer, the mold layer having a groove crossing over the device active pattern;

exposing both sidewalls of the device active pattern by anisotropically etching the device isolation layer exposed by the groove;

implanting impurity ions using the mold layer as a mask to dope a portion of the support pattern;

forming a gate electrode filling the groove and the anisotropically etched region of the device isolation layer; and removing the mold layer.

5. The method of forming a semiconductor device according to claim 4, further comprising forming a capping pattern disposed on the device active pattern before forming the mold layer, wherein the gate electrode is formed to surround a top surface of the capping pattern and both sidewalls of the device active pattern.

6. The method of forming a semiconductor device according to claim 3, wherein the impurity ions for doping a portion of the support pattern are implanted being inclined.

7. The method of forming a semiconductor device according to claim 3, further comprising:

forming a sacrificial spacer on an inner sidewall of the groove before implanting impurity ions for doping a portion of the support pattern; and removing the sacrificial spacer after doping a portion of the support pattern by implanting the impurity ions.

8. The method of forming a semiconductor device according to claim 1, wherein the doped portion of the support pattern and the source/drain region are doped with impurities of different types.

9. The method of forming a semiconductor device according to claim 1, wherein the support pattern is formed of silicon germanium.

10. The method of forming a semiconductor device according to claim 1, wherein the filling insulation pattern includes a vacancy.

11. The method of forming a semiconductor device according to claim 1, further comprising:

forming gate spacers on both sidewalls of the gate electrode, wherein the filling insulation pattern is formed to contain the same material as the gate spacer.

12. The method of forming a semiconductor device according to claim 1, further comprising:

forming a supplementary filling pattern surrounding the device active pattern and sidewalls of the filling insulation pattern at both sides of the gate electrode, wherein the filling insulation pattern is formed containing the same material as the supplementary filling pattern.

13. A method of forming a semiconductor device, comprising:

forming a support pattern and a device active pattern that are sequentially stacked on a substrate;

forming a device isolation layer surrounding sidewalls of the support and device active patterns;

doping a portion of the support pattern;

forming a gate electrode on the doped portion of the support pattern, crossing over the device active pattern;

exposing a sidewall of a non-doped portion of the support pattern by recessing a portion of the device isolation layer placed at both sides of the gate electrode;

forming an undercut region by removing the non-doped portion of the support pattern by means of a selective isotropic etch method;

forming a filling insulation pattern in the undercut region; and forming a source/drain region in the device active pattern at both sides of the gate electrode, wherein the device active pattern under the gate electrode is formed of a strained silicon having a lattice width wider than a silicon lattice width.

14. The method of forming a semiconductor device according to claim 13, wherein the support pattern is formed of silicon germanium.

15. The method of forming a semiconductor device according to claim 13, wherein doping a portion of the support pattern and the forming the gate electrode comprises:

forming a mold layer covering the device active pattern and the device isolation layer;

forming a groove crossing over the device active pattern by patterning the mold layer;

doping a portion of the support pattern by implanting impurity ions using the mold layer as a mask;

forming a gate electrode within the groove, said gate electrode having a gate insulation layer interposed between the gate electrode and the device active pattern; and removing the mold layer.

16. A method of forming a semiconductor device, comprising:

forming a support pattern and a pin-type device active pattern that are sequentially stacked on a substrate;

forming a device isolation layer surrounding sidewalls of the support and device active patterns;

doping a portion of the support pattern;

exposing both sidewalls of the device active pattern placed on a doped portion of the support pattern;

forming a gate electrode crossing over exposed sidewalls and a top surface of the device active pattern;

exposing a sidewall of the non-doped portion of the support pattern by recessing a portion of the device isolation layer;

forming an undercut region by removing the non-doped portion of the support pattern by means of an isotropic etch method;

forming a filling insulation pattern in the undercut region; and forming a source/drain region in the device active pattern at both sides of the gate electrode, wherein the device active pattern under the gate electrode is formed of a strained silicon having a lattice width wider than a silicon lattice width.

17. The method of forming a semiconductor device according to claim 16, wherein the support pattern is formed of silicon germanium.

18. The method of forming a semiconductor device according to claim 16, further comprising:

forming a capping pattern on the device active pattern before forming the gate electrode, wherein the gate electrode is formed to surround a top surface of the capping pattern and both sidewalls of the device active pattern.

19. The method of forming a semiconductor device according to claim 16, wherein doping a portion of the support pattern and forming the gate electrode comprises:

forming a mold layer covering the device active pattern and the device isolation layer;

patterning the mold layer to form a groove that crosses over the device active pattern and exposes a portion of the device isolation layer;

exposing both sidewalls of the device active pattern by anisotropically etching the exposed isolation layer using the mold layer as a mask;

doping a portion of the support pattern by implanting impurity ions using the mold layer as a mask;

forming a gate electrode filling the groove and the anisotropically etched region of the device isolation layer interposed by a gate insulation layer; and removing the mold layer.

* * * * *

UNITED STATES PATENT AND TRADEMARK OFFICE
CERTIFICATE OF CORRECTION

PATENT NO. : 7,510,932 B2  
APPLICATION NO. : 11/764751  
DATED : March 31, 2009  
INVENTOR(S) : Chang-Woo Oh et al.

Page 1 of 1

It is certified that error appears in the above-identified patent and that said Letters Patent is hereby corrected as shown below:

Cover Page, item (73), the Assignee "SAms Samsung Electronics Co., Ltd.," should read -- Samsung Electronics Co., Ltd., --;
Column 13, line 11, the word "for" should read -- For --;
Column 16, line 11, the word "filing" should read -- filling --.

Signed and Sealed this

Twenty-fourth Day of November, 2009

David J. Kappos
*Director of the United States Patent and Trademark Office*